(12) United States Patent
Masuda et al.

(10) Patent No.: US 11,347,146 B2
(45) Date of Patent: May 31, 2022

(54) RESIN COMPOSITION

(71) Applicant: TORAY INDUSTRIES, INC., Tokyo (JP)

(72) Inventors: Yuki Masuda, Otsu (JP); Keika Hashimoto, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 622 days.

(21) Appl. No.: 16/329,441

(22) PCT Filed: Aug. 30, 2017

(86) PCT No.: PCT/JP2017/031099
§ 371 (c)(1),
(2) Date: Feb. 28, 2019

(87) PCT Pub. No.: WO2018/047688
PCT Pub. Date: Mar. 15, 2018

(65) Prior Publication Data
US 2019/0250511 A1      Aug. 15, 2019

(30) Foreign Application Priority Data
Sep. 9, 2016   (JP) .............................. JP2016-176288

(51) Int. Cl.
*G03F 7/039*   (2006.01)
*C08G 73/14*   (2006.01)
(Continued)

(52) U.S. Cl.
CPC ............. *G03F 7/039* (2013.01); *C08G 69/26* (2013.01); *C08G 73/06* (2013.01); *C08G 73/10* (2013.01);
(Continued)

(58) Field of Classification Search
CPC ...... G03F 7/039; G03F 7/0226; G03F 7/0233; G03F 7/162; G03F 7/168; G03F 7/2004;
(Continued)

(56) References Cited

U.S. PATENT DOCUMENTS

2006/0199920 A1   9/2006   Okada et al.
2012/0100484 A1   4/2012   Hirano et al.

FOREIGN PATENT DOCUMENTS

JP   2001-100416 A    4/2001
JP   2004-325980 A   11/2004
(Continued)

OTHER PUBLICATIONS

International Search Report, issued in PCT/JP2017/031099, PCT/ISA/210, dated Oct. 3, 2017.
(Continued)

*Primary Examiner* — Caleen O Sullivan
(74) *Attorney, Agent, or Firm* — Birch, Stewart, Kolasch & Birch, LLP

(57) ABSTRACT

The present invention is a resin composition including (a) a resin, (b) an antioxidizing agent, and (d) a crosslinking agent, wherein the resin composition is characterized by the following: the resin (a) is formed of one or more kinds of resins selected from among polyimide precursor, polyamide, polyimide, polybenzoxazole, and copolymers thereof; and the crosslinking agent (d) includes a phenolic hydroxyl group in one molecule, and also includes a substituent group having a molecular weight of 40 or more at both ortho positions of the phenolic hydroxyl group. Provided is the resin composition by which obtained is a pattern-cured film that enables fine patterns to be obtained, that exhibits excellent in-plane pattern uniformity while being curable at a low temperature of 250° C. or less, and that retains high extensibility and high adhesion with metal wires even after a reliability evaluation which is an actual-use accelerated test.

24 Claims, 5 Drawing Sheets

(51) Int. Cl.

| | |
|---|---|
| C09D 179/08 | (2006.01) |
| G03F 7/16 | (2006.01) |
| G03F 7/20 | (2006.01) |
| G03F 7/32 | (2006.01) |
| G03F 7/40 | (2006.01) |
| H01L 51/00 | (2006.01) |
| H01L 23/00 | (2006.01) |
| H01L 27/12 | (2006.01) |
| H01L 27/32 | (2006.01) |
| H01L 51/56 | (2006.01) |
| G03F 7/022 | (2006.01) |
| C08J 5/18 | (2006.01) |
| G03F 7/023 | (2006.01) |
| C08G 73/06 | (2006.01) |
| C08G 73/10 | (2006.01) |
| C08G 69/26 | (2006.01) |

(52) U.S. Cl.
CPC ........... *C08G 73/14* (2013.01); *C08J 5/18* (2013.01); *C09D 179/08* (2013.01); *G03F 7/0226* (2013.01); *G03F 7/0233* (2013.01); *G03F 7/162* (2013.01); *G03F 7/168* (2013.01); *G03F 7/2004* (2013.01); *G03F 7/322* (2013.01); *G03F 7/40* (2013.01); *H01L 24/03* (2013.01); *H01L 24/05* (2013.01); *H01L 24/13* (2013.01); *H01L 27/1248* (2013.01); *H01L 27/3258* (2013.01); *H01L 51/0018* (2013.01); *H01L 51/0035* (2013.01); *H01L 51/0043* (2013.01); *H01L 51/56* (2013.01); *H01L 2224/024* (2013.01); *H01L 2224/0239* (2013.01); *H01L 2224/02331* (2013.01); *H01L 2224/03002* (2013.01); *H01L 2224/0362* (2013.01); *H01L 2224/03462* (2013.01); *H01L 2224/13024* (2013.01); *H01L 2227/323* (2013.01); *H01L 2924/01029* (2013.01)

(58) Field of Classification Search
CPC . G03F 7/322; G03F 7/40; G03F 7/004; G03F 7/023; G03F 7/16; G03F 7/20; C08G 69/26; C08G 73/06; C08G 73/10; C08G 73/14; C08J 5/18; C09D 179/08; H01L 24/03; H01L 24/05; H01L 24/13; H01L 27/1248; H01L 27/3258; H01L 51/0018; H01L 51/0035; H01L 51/0043; H01L 51/56; H01L 2224/02331; H01L 2224/0239; H01L 2224/024; H01L 2224/03002; H01L 2224/03462; H01L 2224/0362; H01L 2224/13024; H01L 2227/323; H01L 2924/01029; H01L 51/5253; H01L 2224/0401; H01L 2224/04105; H01L 2224/05008; H01L 2224/05082; H01L 2224/05124; H01L 2224/05147; H01L 2224/05166; H01L 2224/05171; H01L 2224/05569; H01L 2224/05572; H01L 2224/12105; H01L 2224/131; H01L 2224/13147; H01L 2224/16238; H01L 2224/81005; H01L 2224/94; H01L 2924/3511; H01L 24/19; H01L 27/1259; H01L 23/485; H01L 23/522; H01L 24/12; H01L 2924/014; H01L 2924/00014; H01L 2224/11; C08K 5/0025; C08K 5/005; C08K 5/13; C08K 5/132; C08K 5/28; C08L 79/08
USPC .................................................. 430/270.1
See application file for complete search history.

(56) References Cited

FOREIGN PATENT DOCUMENTS

| | | |
|---|---|---|
| JP | 2005-309032 A | 11/2005 |
| JP | 2008-58839 A | 3/2008 |
| WO | WO 2010/134207 A1 | 11/2010 |
| WO | WO 2016/035593 A1 | 3/2016 |

OTHER PUBLICATIONS

Written Opinion of the International Searching Authority, issued in PCT/JP2017/031099, PCT/ISA/237, dated Oct. 3, 2017.

RESIN COMPOSITION

TECHNICAL FIELD

The present invention relates to a resin composition. More specifically, the present invention relates to a resin composition to be used suitably for a surface protective film and an interlayer insulating film of a semiconductor element and the like, an insulating layer of an organic electroluminescent device, and the like.

BACKGROUND ART

Conventionally, polyimide resins, polybenzoxazole resins and the like, which are superior in heat resistance, mechanical properties, etc., are widely used for, for example, surface protective films and interlayer insulating films of semiconductor elements of electronic devices. When a polyimide or a polybenzoxazole is used as a surface protective film or an interlayer insulating film, one of methods of forming through hole or the like is etching using a positive-working photoresist. However, this method is problematically complicated because it requires a step of applying and peeling off a photoresist. Therefore, studies have been made on heat resistant materials imparted with photosensitivity for the purpose of rationalizing the working process.

Usually, as to polyimide and polybenzoxazole, a coating film of their precursor is thermally dehydrated and ring-closed to obtain a thin film being superior in heat resistance and mechanical properties. In that case, high temperature baking usually at around 350° C. is required. However, Magnetoresistive Random Access Memory (MRAM), which is promising as a next-generation memory, and a sealing resin are weak against high temperature. Therefore, for use for a surface protective film of such elements or for an interlayer insulating film of a fan-out wafer level package in which a rewiring structure is formed on a sealing resin, there has been demanded polyimide resin or polybenzoxazole resin which is cured by baking at low temperatures of about 250° C. or less and can afford highly reliable film characteristics comparable to those attained for conventional materials by baking at high temperature of about 350° C.

In recent semiconductor packages, the microfabrication of wiring is proceeding along with demands for higher integration, miniaturization and higher speed. Along with this, there is a demand for a photosensitive resin composition capable of forming a fine pattern also in a surface protective film, an interlayer insulating film, and the like, but a non-photosensitive resin composition and a negative-working photosensitive resin composition which is made insoluble in a developing solution through crosslinking of exposed portions cannot form fine patterns and these compositions are problematic in that they afford poor in-plane uniformity due to large film shrinkage upon curing.

On the other hand, when a heat-resistant resin composition is used for applications such as semiconductors, the film after heat curing remains as a permanent film in devices. For this reason, the physical properties of a film after heat curing are important, and after confirming that the cured film after reliability evaluation, which is an accelerated test for practical use, satisfies required specifications on physical properties, especially extension, of the cured film, the composition is used for semiconductor packages. As reliability in a semiconductor package, adhesion to a material formed on a surface of the semiconductor chip is important. In particular, when the heat-resistant resin composition is used for applications such as an insulating film between wiring layers of a wafer level package, adhesion to a metal material to be used for electrodes, wiring, etc. is important. However, the resin composition containing a low-temperature-curable resin has a problem of poor adhesion to metal to be used as such wiring materials. Especially, in the case of a cured resin film made of a photosensitive resin composition capable of forming a fine pattern, additives such as a photosensitizer, a sensitizer, an acid generator and a dissolution modifier, which constitute the composition, will remain in the cured film after heat curing, and therefore, the adhesion strength is lower than the adhesion strength of those free from additives.

To solve these problems, there are disclosed a photosensitive resin composition that suppresses copper corrosion by adding a copper discoloration inhibitor to a photosensitive resin (see Patent Document 1) and a photosensitive resin composition capable of affording adhesion to copper and high extension by adding a heterocyclic compound to a polybenzoxazole having an aliphatic group (see Patent Document 2). Studies have also been made to improve the extension by adding an antioxidizing agent and an epoxy resin to a polyimide resin (see Patent Document 3).

PRIOR ART DOCUMENTS

Patent Documents

Patent Document 1: Japanese Patent Laid-open Publication No. 2011-169980
Patent Document 2: Japanese Patent Laid-open Publication No. 2010-96927
Patent Document 3: Japanese Patent Laid-open Publication No. 2010-77382

SUMMARY OF THE INVENTION

Problems to be Solved by the Invention

However, in a cured film of the photosensitive resin composition in which a copper discoloration inhibitor is added to a photosensitive resin and a cured film of the photosensitive resin composition in which a heterocyclic compound is added to a polybenzoxazole having an aliphatic group, a crosslinking agent and an antioxidizing agent are not appropriately combined for use, and therefore, these cured films have problems of being poor in in-plane uniformity, and being low in extension after reliability evaluation such as a high temperature holding test, a constant temperature high humidity test, or a thermal cycle test. Further, the cured films have a problem of being peeled off from metal wirings. Also, the resin composition in which an antioxidizing agent and an epoxy resin are added to a polyimide resin is difficult to form a fine pattern because in-plane film thickness and pattern are not uniform due to large shrinkage after curing and decrease in extension occurs because of using no appropriate crosslinking agent.

The present invention has been devised in view of the problems with the conventional technologies as described above, and provides a resin composition from which a pattern-cured film is obtained that has a fine pattern, that exhibits superior in-plane uniformity while being curable at a low temperature of 250° C. or less, and that retains high extension and high adhesion with metal wirings even after a reliability evaluation.

Solutions to the Problems

In order to solve the above problems, the present invention is characterized by the following configurations.

[1] A resin composition comprising a resin (a), an antioxidizing agent (b), and a crosslinking agent (d), wherein
the resin (a) contains one or more resins selected from a polyimide precursor, a polyamide, a polyimide, polybenzoxazole, and copolymers thereof, and
the crosslinking agent (d) is a crosslinking agent having a phenolic hydroxyl group in one molecule thereof and having substituents each with a molecular weight of 40 or more at both ortho positions to the phenolic hydroxyl group.

[2] The resin composition according to [1], wherein the resin (a) is an alkali-soluble resin having a phenolic hydroxyl group, and the resin composition further contains a naphthoquinonediazide compound (c).

[3] The resin composition according to [1] or [2], wherein the crosslinking agent (d) is a crosslinking agent having three or more phenolic hydroxyl groups in one molecule thereof.

[4] The resin composition according to any one of [1] to [3], wherein the antioxidizing agent (b) is an antioxidizing agent having a hindered phenol structure.

[5] The resin composition according to any one of [1] to [4], wherein the antioxidizing agent (b) contains a compound represented by a general formula (1):

[Chemical Formula 1]

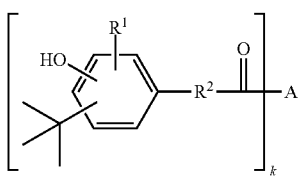

(1)

in the general formula (1), $R^1$ represents a hydrogen atom or an alkyl group having 2 or more carbon atoms; $R^2$ represents an alkylene group having 2 or more carbon atoms; A represents a monovalent to tetravalent organic group containing at least one of an alkylene group having 2 or more carbon atoms, an O atom, and an N atom; and k represents an integer of 1 to 4.

[6] The resin composition according to any one of [1] to [5], wherein the resin (a) has a structural unit represented by a general formula (2):

[Chemical Formula 2]

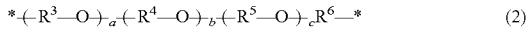

(2)

in the general formula (2), $R^3$ to $R^6$ each independently represent an alkylene group having 2 to 10 carbon atoms, a, b and c each represent an integer within ranges of $1 \leq a \leq 20$, $0 \leq b \leq 20$ and $0 \leq c \leq 20$, and arrangement of repeating units may be either in a block manner or in a random manner; and in the general formula (2), * represents a chemical bond.

[7] The resin composition according to any one of [1] to [6], wherein
the resin (a) contains at least a copolymer of a polyamide and a polyimide, and
the polyamide has a structural unit derived from a diamine having an aliphatic group, and a content of the structural unit derived from the diamine having an aliphatic group based on 100% by mole of structural units derived from diamines is in a range of 5 to 40% by mole.

[8] The resin composition according to any one of [1] to [7], wherein
the resin (a) contains at least a copolymer of a polyamide and a polyimide, and
a content of a structural unit of the polyimide based on 100% by mole of structural units of the polyamide and the polyimide in total is in a range of 2 to 50% by mole.

[9] The resin composition according to any one of [1]

[Chemical Formula 3]

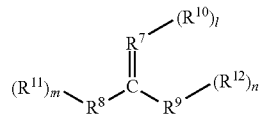

(3)

in the general formula (3), $R^7$ to $R^9$ each represent an O atom, an S atom, or an N atom, and at least one of $R^7$ to $R^9$ represents an S atom; l represents 0 or 1, and m and n represent an integer of 0 to 2; $R^{10}$ to $R^{12}$ each independently represent a hydrogen atom or an organic group having 1 to 20 carbon atoms.

[10] The resin composition according to any one of [1] to [9], further comprising a heat-crosslinking agent (f) having a structural unit represented by a general formula (4) below:

[Chemical Formula 4]

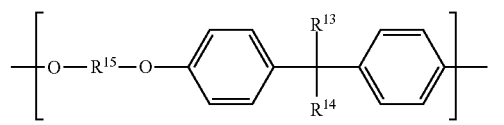

(4)

in the general formula (4), $R^{13}$ and $R^{14}$ each independently represent a hydrogen atom or a methyl group; $R^{15}$ is a divalent organic group having an alkylene group having 2 or more carbon atoms and may be any of linear, branched, and cyclic.

[11] A resin sheet formed from the resin composition according to any one of [1] to [10].

[12] A cured film obtained by curing the resin composition according to any one of [1] to [10].

[13] A cured film obtained by curing the resin sheet according to [11].

[14] The cured film according to [12] or [13], which has an elongation at break of 50% or more.

[15] A method for producing a relief pattern of a cured film, comprising the steps of:
applying the resin composition according to any one of [2] to [10] onto a substrate or laminating the resin sheet according to claim 11 onto a substrate, followed by drying to form a resin film;
applying light via a mask; eluting or removing an irradiated part with an alkaline solution to perform development; and
heat treating the resin film after the development.

[16] The method for producing a relief pattern of a cured film according to [15], wherein the step of applying the resin composition onto a substrate, followed by drying to form a resin film includes a step of applying the resin composition onto the substrate using a slit nozzle.

[17] A semiconductor electronic component or semiconductor device, comprising the cured film according to any one of [12] to [14] disposed as an interlayer insulating film between rewirings of copper metal.

[18] The semiconductor electronic component or semiconductor device according to [17], wherein the rewirings are composed of oxidized copper metal wirings.

[19] The semiconductor electronic component or semiconductor device according to [17] or [18], wherein the rewirings are copper metal wirings, and a line width of the copper metal wirings and an interval between adjacent wirings are 5 μm or less.

[20] A semiconductor electronic component or semiconductor device, comprising the cured film according to any one of [12] to [14] disposed as an interlayer insulating film between rewirings on a sealing resin substrate on which a silicon chip is disposed.

[21] The semiconductor electronic component or semiconductor device according to [17] to [20], wherein the rewirings are copper metal wirings, and a semiconductor chips and each of the copper metal wirings are further connected via a bump.

[22] The semiconductor electronic component or semiconductor device according to [17] to [21], wherein a line width of metal wirings and an interval between adjacent wirings decrease as a rewiring layer recited in [17] approaches the semiconductor chip.

[23] The semiconductor electronic component or semiconductor device according to [17] to [22], wherein the interlayer insulating film recited in [17] becomes thin in thickness as the interlayer insulating film approaches the semiconductor chip.

[24] An organic EL display device comprising the cured film according to any one of [12] to [14].

[25] A method for producing a semiconductor electronic component or semiconductor device, comprising the steps of:

disposing the cured film according to any one of [12] to [14] as an interlayer insulating film between rewirings on a support substrate on which a temporary sticking material is disposed;

disposing a silicon chip and a sealing resin on the support substrate; and then peeling off the rewirings from the support substrate on which a temporary sticking material is disposed.

Effects of the Invention

Provided is a resin composition from which a fine pattern is obtained and a pattern-cured film is obtained that exhibits superior in-plane uniformity while being curable at a low temperature of 250° C. or less, and that retains high extension and high adhesion with metal wirings even after a reliability evaluation.

EMBODIMENTS OF THE INVENTION

Figure 1:
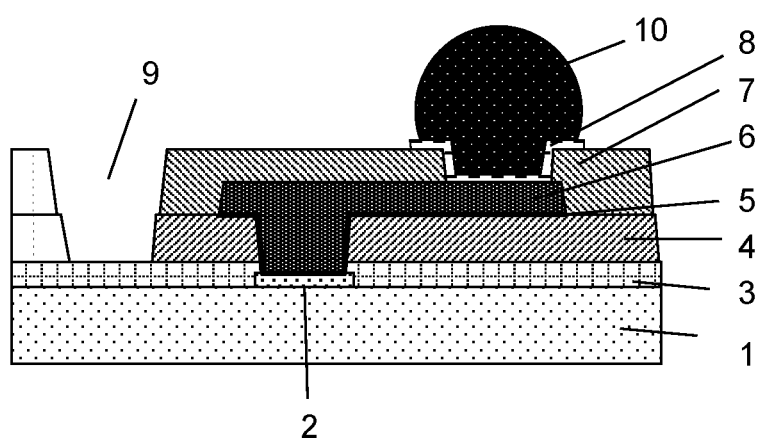
FIG. 1 depicts an enlarged cross-sectional view of a pad portion of a semiconductor device having a bump.

The resin composition of the present invention is a resin composition comprising a resin (a), an antioxidizing agent (b), and a crosslinking agent (d), wherein the resin (a) contains one or more resins selected from a polyimide precursor, a polyamide, a polyimide, polybenzoxazole, and copolymers thereof, and the crosslinking agent (d) is a crosslinking agent having a phenolic hydroxyl group in one molecule thereof and having substituents each with a molecular weight of 40 or more at both ortho positions to the phenolic hydroxyl group.

By appropriate use of the antioxidizing agent (b) and the crosslinking agent (d), the resin composition of the present invention can afford a pattern-cured film that has a fine pattern, that exhibits superior in-plane uniformity while being curable at a low temperature of 250° C. or less, and that retains high extension and high adhesion with metal wirings even after a reliability evaluation.

Moreover, the case where the resin (a) is an alkali-soluble resin having a phenolic hydroxyl group and the resin composition further contains a naphthoquinonediazide compound (c) is preferable because a finer pattern can be obtained and complicated steps can be omitted, so that it becomes possible to rationalize the work.

In the present invention, the alkali-soluble resin is a resin soluble in an aqueous alkali solution of tetramethylammonium hydroxide, choline, triethylamine, dimethylaminopyridine, monoethanolamine, diethylaminoethanol, sodium hydroxide, potassium hydroxide, sodium carbonate, etc.

The polyamide structure is a benzoxazole precursor with two sets of amino group and hydroxyl group located in the ortho position to each other, other polyhydroxyamide, a polyamide or a copolymerized structure thereof. The polyimide precursor structure mentioned above is a polyamic acid, a polyamic acid ester, or a structure in which the resin ends or the resin side chain is blocked with an amic acid or an amic acid ester.

In addition, the resin (a) preferably has a structural unit represented by the general formula (2):

[Chemical Formula 5]

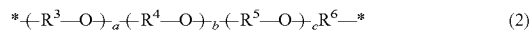

$$*\text{---}(R^3\text{---}O)_a\text{---}(R^4\text{---}O)_b\text{---}(R^5\text{---}O)_c R^6\text{---}* \quad (2)$$

in the general formula (2), $R^3$ to $R^6$ each independently represent an alkylene group having 2 to 10 carbon atoms, a, b and c each represent an integer within ranges of $1 \leq a \leq 20$, $0 \leq b \leq 20$ and $0 \leq c \leq 20$, and arrangement of repeating units may be either in a block manner or in a random manner; and in the general formula (2), * represents a chemical bond.

In the structural unit represented by the general formula (2), due to the stretchability of the ether group, high extensibility can be imparted to a cured film when the resin composition is formed into a cured film. Moreover, the presence of the ether group can provide complex formation with a metal or hydrogen bond formation, which provides high adhesion to metals.

Further, preferably, the resin (a) contains at least a copolymer of a polyamide and a polyimide, the polyamide has a structural unit derived from a diamine having an aliphatic group, and a content of the structural unit derived from the diamine having an aliphatic group based on 100% by mole of structural units derived from diamines is in a range of 5 to 40% by mole.

In the present invention, a diamine residue having an aliphatic group is preferably included in at least any structure of the polyamide, imide precursor and polyimide. While the diamine residue may be included either in any one structure or in all structures, it is preferably included in the polyamide structure because an effect of imparting high extensibility and high adhesion to metals. When the content of the structural unit derived from the diamine having an aliphatic group based on 100% by mole of structural units derived from diamines is 5% by mole or more, an effect of high adhesion to metals by the diamine residue having an aliphatic group can be achieved. When the content of the structural unit is 40% by mole or less, the oxidative degradation of the aliphatic group hardly occurs, and therefore, peeling off from a metal substrate is prevented and a highly reliable cured film can be obtained. Accordingly, the above range is preferable.

With the polyimide structure, it is possible to enhance interaction with metals and adhesion to metals after the resin composition is formed into a cured film, as compared with a case of a sole polyamide structure.

Furthermore, the content of a structural unit of the polyimide based on 100% by mole of structural units of the polyamide and the polyimide in total of the resin (a) is preferably in a range of 2 to 50% by mole. When the content of the polyimide structure is 2% by mole or more, it is possible to enhance interaction with metals and adhesion to metals after the resin composition is formed into a cured film, as compared with a case of a sole polyamide structure. When the content of the polyimide structure is 50% by mole or less, it is possible to achieve high extensibility by the polyamide. Accordingly, the above range is preferable.

In the present invention, the resin (a) is preferably a resin in which the polyamide has a structure represented by the general formula (5), the polyimide precursor and the polyimide have at least one structure selected from the structures represented by the general formula (6) and the general formula (7), and the polybenzoxazole has a structure represented by the general formula (8).

[Chemical Formula 6]

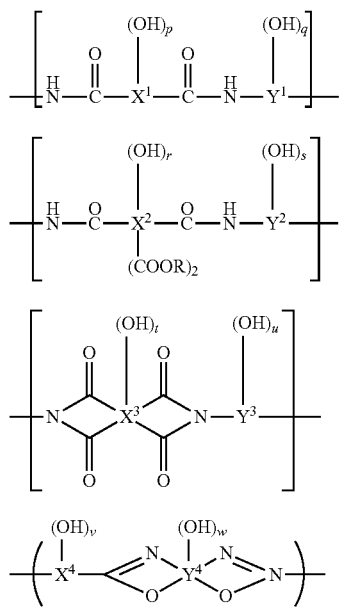

in the general formulas (5) to (8), $X^1$ represents a divalent to hexavalent organic group, $X^2$ and $X^3$ each independently represent a tetravalent to decavalent organic group, $X^4$ represents a divalent to hexavalent organic group, $Y^1$ to $Y^3$ each independently represent a divalent to tetravalent organic group, $Y^4$ represents a tetravalent to hexavalent organic group, and R represents a hydrogen atom or an organic group having 1 to 20 carbon atoms; p, q, r, s, t, u, v, and w are each independently an integer of 0 to 4.

In the above general formula (5), $X^1$ and $X^4$ each represent a divalent to hexavalent organic group having 2 or more carbon atoms and represent a structural component of an acid. $X^1$ and $X^4$ are each structures derived from an aromatic dicarboxylic acid, such as terephthalic acid, isophthalic acid, diphenyl ether carboxylic acid, naphthalenedicarboxylic acid, and bis(carboxyphenyl)propane; an aliphatic dicarboxylic acid, such as cyclobutanedicarboxylic acid, cyclohexanedicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, and diglycolic acid; a dicarboxylic acid having a structure represented by the following general formula; a tricarboxylic acid, such as trimellitic acid or trimesic acid; the foregoing with substitution of a part of hydrogen atoms of an aromatic ring or hydrocarbon thereof with an alkyl group or fluoroalkyl group having 1 to 10 carbon atoms, a halogen atom, or the like; or the foregoing including a linkage of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like.

[Chemical Formula 7]

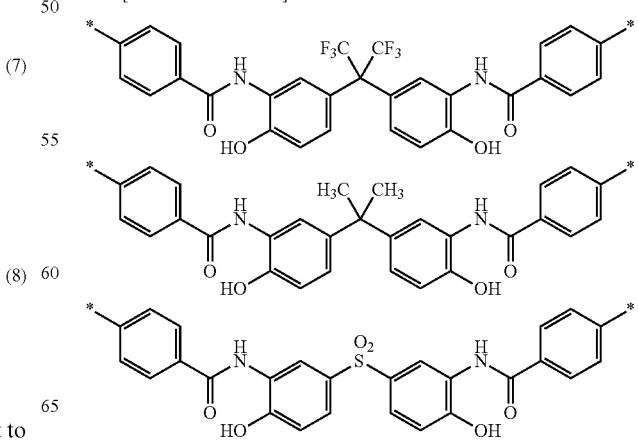

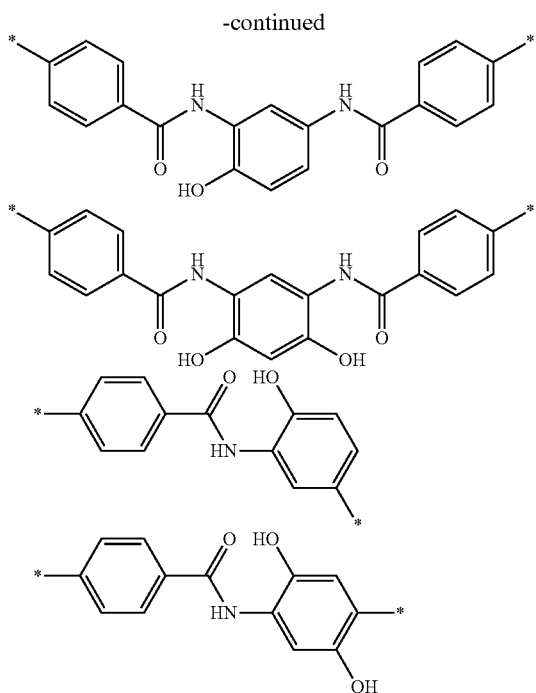

Among these, a structure derived from a dicarboxylic acid in which $X^1$ and $X^4$ are aromatic is preferable for the reason that increase in stress by film shrinkage is suppressed and adhesion is enhanced because it is unlikely to undergo ring-closure in heat-curing.

In the production of the resin, when a polycondensation is carried out, for example, a compound is used in which carboxylic acids of $X^1$ and $X^4$ are each substituted by an active carboxylic acid group represented by the following general formula.

[Chemical Formula 8]

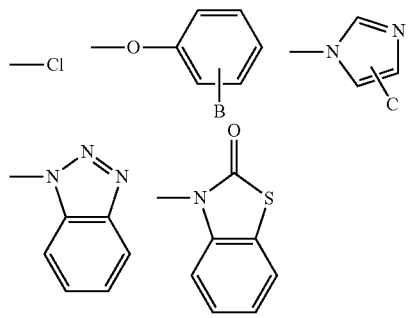

wherein B and C each independently are, but are not limited to, a hydrogen atom, methyl group, ethyl group, propyl group, isopropyl group, t-butyl group, trifluoromethyl group, halogen group, phenoxy group, nitro group, or the like.

Among these, it is preferable to use an active carboxylic acid group other than chloride compounds. Use of the active carboxylic acid group other than chloride compounds can reduce chloride ions in the resulting resin and prevent peeling off from the metal substrate caused by the presence of chloride ions. In addition, it is more preferable to use a diimidazolide compound as an active carboxylic acid group.

A leaving group of a diimidazolide compound forms a water soluble imidazole, so that it is possible to carry out reprecipitation and washing of the obtained resin with water. Moreover, the leaved imidazole is basic, so that it acts as a ring-closing promoter for the polyimide precursor structure in polymerization to allow a ring closure ratio of imidization to be high in the step where a polyamide resin is produced. As a result, a ring closure ratio can be lowered when a cured film is formed by heat treatment.

$Y^1$ to $Y^3$ in the general formulas (5) to (7) each represent a divalent to tetravalent organic group, and $Y^4$ represents a tetravalent to hexavalent organic group and represents an organic group derived from a diamine.

$Y^1$ to $Y^4$ in the general formulas (5) to (7) preferably include a diamine residue having a phenolic hydroxyl group. By the inclusion of the diamine residue having a phenolic hydroxyl group, appropriate solubility of a resin in an alkaline developing solution is obtained, so that a high contrast between exposed and unexposed portions can be obtained to form a desired pattern.

Specific examples of the diamine having a phenolic hydroxyl group may include, but are not limited to, aromatic diamines, such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, 2,2'-ditrifluoromethyl-5,5'-dihydroxyl-4,4'-diaminobiphenyl, bis(3-amino-4-hydroxyphenyl)fluorene, 2,2'-bis(trifluoromethyl)-5,5'-dihydroxybenzidine, these compounds in which a part of hydrogen atoms of an aromatic ring or hydrocarbon thereof is substituted by an alkyl group or fluoroalkyl group having 1 to 10 carbon atoms, a halogen atom, or the like, and a diamine having the structure shown below. Other diamines to be copolymerized can be used as they are or as corresponding diisocyanate compounds or trimethylsilylated diamines. Moreover, these two or more diamine components may be used in combination.

[Chemical Formula 9]

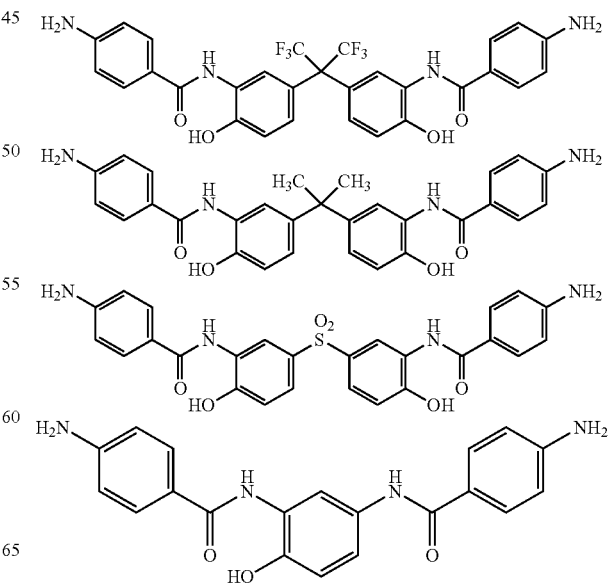

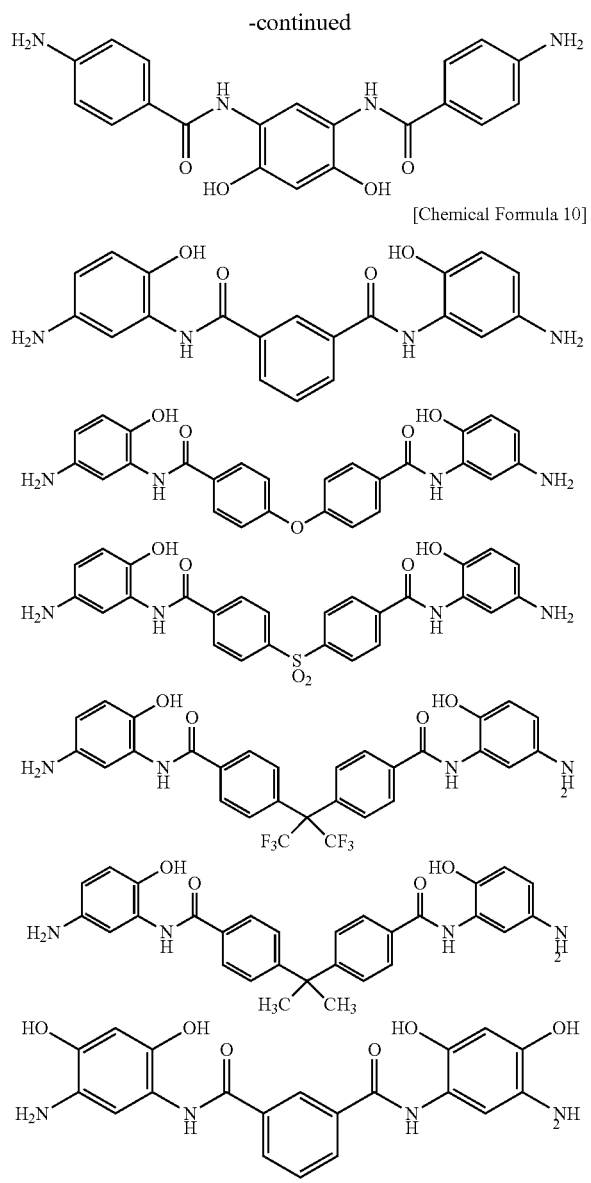

[Chemical Formula 10]

$Y^1$ to $Y^4$ may include a diamine residue having an aromatic group other than the above. By copolymerizing them, heat resistance can be improved. Specific examples of the diamine residue having an aromatic group may include, but are not limited to, aromatic diamines such as 3,4'-diaminodiphenyl ether, 4,4'-diaminodiphenyl ether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzine, m-phenylenediamine, p-phenylenediamine, 1,5-naphthalenediamine, 2,6-naphthalenediamine, bis(4-aminophenoxyphenyl) sulfone, bis(3-aminophenoxyphenyl)sulfone, bis(4-aminophenoxy)biphenyl, bis {4-(4-aminophenoxy)phenyl}ether, 1,4-bis(4-aminophenoxy)benzene, 2,2'-dimethyl4,4'-diaminobiphenyl, 2,2'-diethyl4,4'-diaminobiphenyl, 3,3'-dimethyl4,4'-diaminobiphenyl, 3,3'-diethyl4,4'-diammobiphenyl, 2,2',3,3'-tetramethyl4,4'-diaminobiphenyl, 3,3'4,4'-tetramethyl4,4'-diaminobiphenyl, and 2,2'-bis (trifluoromethyl)-4.4'-diaminobiphenyl, compounds in which a part of hydrogen atoms of an aromatic ring or hydrocarbon thereof is substituted by an alkyl group or fluoroalkyl group having 1 to 10 carbon atoms, a halogen atom, and the like. Other diamines to be copolymerized can be used as they are or as corresponding diisocyanate compounds or trimethylsilylated diamines. Moreover, these two or more diamine components may be used in combination.

$Y^1$ to $Y^4$ preferably include a diamine residue having an aliphatic group. The diamine residue having an aliphatic group has high affinity with metals so that a resin with high adhesion to metals can be provided. In addition, an aliphatic diamine is high in basicity, so that it acts as a ring-closing promoter in polymerization to allow a ring closure ratio of an imide skeleton to be high in the step where a polyamide resin is produced. As a result, a ring closure ratio can be lowered in heat-curing, and it is possible to suppress shrinkage of the cured film and increase in stress of the cured film generated by the shrinkage. This makes it possible to suppress decrease in adhesion due to stress. In addition, a flexible aliphatic diamine residue contributes to high extensibility of a polyamide, so that adhesion to metals is enhanced and a cured film with low stress and high extensibility can be obtained.

In the present invention, the diamine including an aliphatic group preferably has at least any organic group of an alkyl group and an alkyl ether group. Specifically, it is a diamine containing at least one selected from an alkyl group, a cycloalkyl group, an alkyl ether group and a cycloalkyl ether group, and a part of hydrogen atoms of hydrocarbon thereof may be substituted by an alkyl group or fluoroalkyl group having 1 to 10 carbon atoms, a halogen atom, or the like. The diamine optionally has a linkage of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like, and these organic group may have an unsaturated bond or an alicyclic structure.

In the present invention, the diamine having an aliphatic group as referred to means a diamine including no siloxane structure. The reason for this is that, when a diamine has a siloxane structure, adhesion to a silicon substrate can be enhanced, but the effect of imparting high extensibility or high adhesion to metals, which is an object of the present invention, is low. In the present invention, when a siloxane structure is included for the purpose of enhancing adhesion to a silicon substrate, the siloxane structure can be included in $Y^1$ to $Y^4$ in the general formulas (5) to (8) as described below.

Specific compounds of the diamine having an aliphatic group include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis (cyclohexylamine), 4,4'-methylene bis(2-methylcyclohexylamine), 1,2-bis(2-aminoethoxy)ethane; and KH-51-1, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700 (these are trade names; produced by HUNTSMAN Corporation), and further include the following compounds. A part of hydrogen atoms of an aromatic ring or hydrocarbon of the compounds is optionally substituted by an alkyl group or fluoroalkyl group having 1 to 10 carbon atoms, a halogen atom or the like, and the compounds optionally have a linkage such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like.

[Chemical Formula 11]

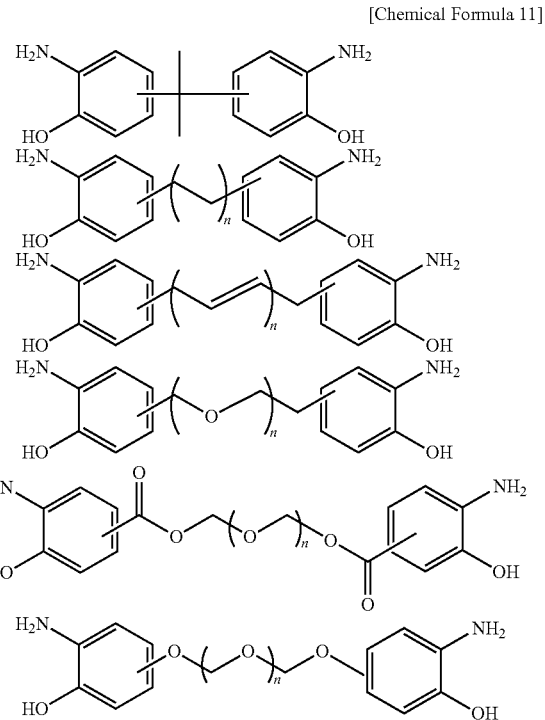

wherein n is an integer of 1 to 20.

In the present invention, the diamine having an aliphatic group is an organic group having at least one selected from an alkyl group and an alkyl ether group, which preferably has an acyclic structure with a linear main chain because better flexibility and stretchability can be obtained and lower stress and higher extensibility can be achieved when the resin composition is formed into a cured film.

In addition, the diamine residue having an aliphatic group more preferably has a structural unit represented by the general formula (2),

[Chemical Formula 12]

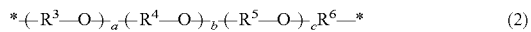

(2)

in the general formula (2), $R^3$ to $R^6$ each independently represent an alkylene group having 2 to 10 carbon atoms, a, b and c each represent an integer within ranges of 1≤a≤20, 0≤b≤20 and 0≤c≤20, and arrangement of repeating units may be either in a block manner or in a random manner; in the general formula (2), * represents a chemical bond.

In the structural unit represented by the general formula (2), due to the stretchability of the ether group, high extensibility can be imparted to a cured film when the resin composition is formed into a cured film. Moreover, the presence of the ether group can provide complex formation with a metal or hydrogen bond formation, which provides high adhesion to metals.

Examples of the compounds having a structural unit represented by the general formula (2) include, but are not limited to, 1,2-bis(2-aminoethoxy)ethane, KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, HT-1700 (these are trade names; produced by HUNTSMAN Corporation), and compounds represented by the following formulas. A part of hydrogen atoms of an aromatic ring or hydrocarbon of the compounds is optionally substituted by an alkyl group or fluoroalkyl group having 1 to 10 carbon atoms, a halogen atom, or the like, and the compounds optionally have a linkage of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like.

[Chemical Formula 13]

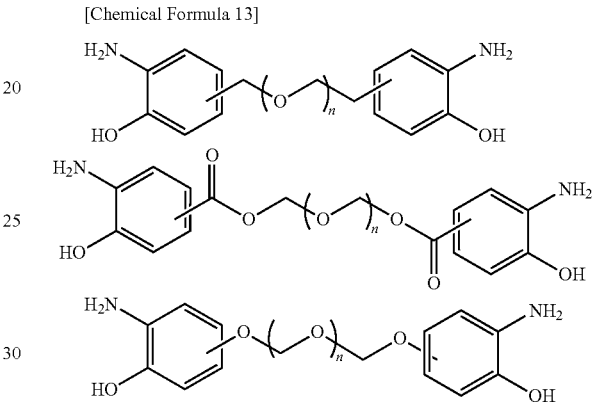

wherein n is an integer of 1 to 20.

The structural unit represented by the general formula (2) has a number average molecular weight of preferably 150 or more and 2,000 or less. The number average molecular weight of the structural unit represented by the general formula (2) is preferably 150 or more, more preferably 600 or more, and still more preferably 900 or more because high flexibility and stretchability can be achieved. Additionally, the number average molecular weight of the structural unit represented by the general formula (2) is preferably 2,000 or less, more preferably 1,800 or less, and still more preferably 1,500 or less because solubility in an alkaline solution can be maintained.

Moreover, among alkyl ethers, a tetramethylene ether group is preferable because it can impart adhesion to metal after reliability evaluation due to its superior heat resistance. Examples thereof include, but are not limited to, RT-1000, HE-1000, HT-1100, and HT-1700 (these are trade names; produced by HUNTSMAN Corporation).

In addition, it is preferable that the diamine having an aliphatic group have a structure having no aromatic group. With no aromatic group, it is possible to impart sufficient flexibility, so that it is possible to impart high extensibility.

Use of such a diamine having an aliphatic group can impart low-stress property, high extensibility, and high adhesion to metal to the resulting cured film while maintaining solubility in an alkaline solution.

In the present invention, the content of the diamine residue having an aliphatic group is preferably 5% to 40% by mole of all diamine residues. When the content of the diamine residue having an aliphatic group is 5% by mole or more, an effect of high adhesion to metal by the diamine residue having an aliphatic group can be achieved. When the content of the diamine residue having an aliphatic group is 40% by mole or less, peeling off from a metal substrate is prevented due to low hygroscopicity of the resin and a highly reliable cured film can be obtained. Accordingly, the above range is preferable.

The arrangement of repeating units of the diamine residue having an aliphatic group may be either in a block manner or in a random manner, and they are preferably included in the polyamide structure represented by the general formula (5) because high adhesion to metal and low stress can be imparted to the polyamide structure and extensibility is improved.

In addition, $Y^1$ to $Y^3$ in the general formulas (5) to (7) may be copolymerized with an aliphatic group having a siloxane structure in order to enhance adhesion to a silicon substrate. Specific examples thereof include those produced by copolymerization with, as a diamine component, bis(3-aminopropyl)tetramethyldisiloxane, bis(p-aminophenyl)octamethylpentasiloxane, and the like in an amount of 1 to 10% by mole.

In the above general formula (6), which is the polyimide precursor structure, and the general formula (7), which is the polyimide structure, $X^2$ to $X^3$ each represent an acid dianhydride residue and are a tetravalent to decavalent organic group.

Specific examples of the acid dianhydrides may include, but are not limited to, aromatic tetracarboxylic acid dianhydrides, such as pyromellitic dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl) ether dianhydride, 1,2,5,6-naphthalenetetracarboxylic acid dianhydride, 9,9-bis(3,4-dicarboxyphenyl)fluorenic acid dianhydride, 9,9-bis{4-(3,4-dicarboxypbenoxy)phenyl}fluorenic acid dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, and 2,2-bis(3,4-dicarboxyphenyl)hexafluoropropane dianhydride; 3,3',4,4'-diphenylsulfonetetracarboxylic acid dianhydride, 1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4-dicarboxy-1,2,3,4-tetrahydro-1-naphthalenesuccinic dianhydride, 5-(2,5-dioxotetrahydrofuryl)-3-methyl-3-cyclohexene-1,2-dicarboxylic acid dianhydride, 2,3,5-tricarboxy-2-cyclopentaneacetic dianhydride, bicyclo[2.2.2]oct-7-en-2,3,5,6-tetracarboxylic acid dianhydride, 2,3,4,5-tetrahydrofurantetracarboxylic acid dianhydride, 3,5,6-tricarboxy-2-norbornaneacetic dianhydride, 1,3,3a,4,5,9b-hexahydro-5-(tetrahydro-2,5-dioxo-3-furanyl)naphtho[1,2-c]furan-1,3-dione, acid dianhydrides having a structure represented by the following formula, and compounds in which a part of hydrogen atoms of an aromatic ring or hydrocarbon thereof is substituted by an alkyl group or fluoroalkyl group having 1 to 10 carbon atoms, a halogen atom, and the like.

[Chemical Formula 14]

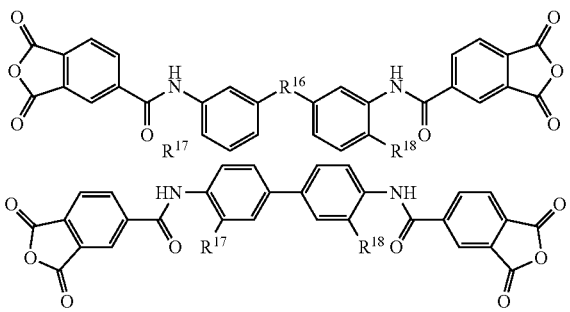

$R^{16}$ represents an oxygen atom, $C(CF_3)_2$, $C(CH_3)_2$ or $SO_2$, and $R^{17}$ and $R^{18}$ each represent a hydrogen atom, a hydroxyl group or a thiol group.

Among these, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl) ether dianhydride, 2,2-bis(3,4-dicarboxyphenyl)hexafluoropropane dianhydride, 3,3',4,4'-diphenyl sulfone tetracarboxylic acid dianhydride, 9,9-bis (3,4-dicarboxyphenyl)fluorenic acid dianhydride, 9,9-bis{4-(3,4-dicarboxyphenoxy)phenyl}fluorenic acid dianhydride, butanetetracarboxylic acid dianhydride, 1,2,3,4-cyclopentanetetracarboxylic acid dianhydride, 1,2,4,5-cyclohexanetetracarboxylic dianhydride, and 1,3,3a,4,5,9b-hexahydro-5-(tetrahydro-2,5-dioxo-3-furanyl)naphtho[1,2-c]fran-1,3-dione are preferable. These are used solely or in any combination of two kinds or more thereof.

R of the general formula (6) represents a hydrogen atom or a monovalent organic group having 1 to 20 carbon atoms. It is preferable that 10% by mole to 90% by mole of R be a hydrogen atom from the viewpoint of solubility in an alkaline developing solution and solution stability of the resulting resin composition. Further, it is more preferable that R include at least one monovalent hydrocarbon group having 1 to 16 carbon atoms and the other are hydrogen atoms.

In addition, in order to obtain a cured film that exhibits high extensibility and high adhesion to metals, the content of the structural unit of the polyimide based on 100% by mole of the structural units of the polyamide and the polyimide in total of the resin (a) is preferably in the range of 2 to 50% by mole. When the content of the polyimide structure is 2% by mole or more, it is possible to enhance interaction with metals and adhesion to metals after the resin composition is formed into a cured film, as compared with a case of a sole polyamide structure. When the content of the polyimide structure is within 50% by mole, it is possible to achieve high extensibility by the polyamide. Accordingly, the above range is preferable.

The molar ratio of the structures represented by the general formulas (5) to (8) in the present invention can be confirmed by a method in which the molar ratio is calculated based on a molar ratio of monomers used in polymerization, or by a method in which peaks of the polyamide structure, imide precursor structure and imide structure from the obtained resin, resin composition and cured film are detected using nuclear magnetic resonance spectroscopy (NMR).

In the present invention, the resin (a) preferably has a weight average molecular weight of 3,000 to 200,000. Within this range, appropriate solubility in an alkaline developing solution is obtained, so that a high contrast between exposed and unexposed portions can be obtained and a desired pattern can be formed. From the viewpoint of solubility in an alkaline developing solution, the weight average molecular weight is more preferably 100,000 or less, and more preferably 50,000 or less. Moreover, from the viewpoint of enhancing extension, the weight average molecular weight is preferably 1.0000 or more. Here, the molecular weight can be obtained by measurement with gel permeation chromatography (GPC) and then conversion of the data based on a calibration curve produced from standard polystyrenes.

In order to enhance the storage stability of the resin composition of the present invention, the ends of the main chain of the polyamide resin may be blocked with an end blocking agent such as a monoamine, a monocarboxylic acid, an acid anhydride, or an active monoester compound.

Moreover, by blocking the ends of the polyamide resin with an end blocking agent having a hydroxyl group, a carboxyl group, a sulfonic acid group, a thiol group, a vinyl group, an ethynyl group, or an allyl group, a dissolution rate of the polyamide resin in an alkaline solution and mechanical properties of the resulting cured film can be easily adjusted to a preferable range.

The proportion of the end blocking agent to be introduced is preferably 0.1% by mole or more, more preferably 5% by mole or more based on the total amine components in order to suppress decrease in solubility in an alkaline solution due to an increased weight average molecular weight of the polyamide resin. In addition, the proportion is preferably 60% by mole or less, more preferably 50% by mole or less in order to suppress lowering of the mechanical properties of the resulting cured film due to a decreased weight average molecular weight of the polyamide resin. Moreover, a plurality of end groups may be introduced by the reaction of a plurality of end blocking agents.

Specific examples of the monoamine as the end blocking agent that can be used include M-600, M-1000, M-2005, and M-2070 (these are trade names; produced by HUNTSMAN Corporation), and aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, and the like. Two or more of them may be used in combination.

Examples of the monocarboxylic acid and the active monoester compound as the end blocking agent that can be used include monocarboxylic acids and active ester compounds resulting therefrom with their carboxyl groups being esterified, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid and 4-carboxybenzenesulfonic acid; acid anhydrides, such as phthalic anhydride, maleic anhydride, nadic anhydride, cyclohexane dicarboxylic anhydride, and 3-hydroxyphthalic anhydride; dicarboxylic acids, such as phthalic acid, maleic acid, nadic acid, cyclohexane dicarboxylic acid, 3-hydroxyphthalic acid, 5-norbornene-2,3-dicarboxylic acid; tricarboxylic acids, such as trimellitic acid, trimesic acid, and diphenyl ether tricarboxylic acid; active ester compounds produced via a reaction of one carboxyl group of a dicarboxylic acid, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene, with N-hydroxybenzotriazole, imidazole, or N-hydroxy-5-norbornene-2,3-dicarboximide; and compounds in which a part of hydrogen atoms of an aromatic ring or hydrocarbon thereof is substituted by an alkyl group or fluoroalkyl group having 1 to 10 carbon atoms, a halogen atom, and the like. Two or more of them may be used in combination.

In addition, a structure is preferable in which the resin ends or resin side chains of the resin (a) in the present invention are blocked with an imide precursor such as an amic acid or an amic acid ester or an imide. The ends of the resin (a) have more sites to come into contact with other components or a substrate than the main chain of the resin (a), so that they can enhance adhesion and the storage stability of the resin composition. Therefore, it is preferable to be an imide precursor structure or have an imide precursor structure and it is more preferable that the above general formula (6), which is a polyimide precursor structure, and the general formula (7), which is a polyimide structure, exist near the ends of the resin (a). This makes it possible to enhance adhesion and further enhance the storage stability of the resin (a). For that purpose, it is preferable that the polyamide structure be polymerized, followed by copolymerization with at least any structure of the polyimide precursor structure and the polyimide structure.

The structure in which the resin ends or resin side chains of the resin (a) is blocked with an imide precursor such as an amic acid or an amic acid ester or an imide can be obtained from, without limitation, acid anhydrides, such as phthalic anhydride, maleic anhydride, nadic anhydride, cyclohexane dicarboxylic anhydride, and 3-hydroxyphthalic anhydride; dicarboxylic acids, such as phthalic acid, maleic acid, nadic acid, cyclohexane dicarboxylic acid, 3-hydroxyphthalic acid, 5-norbornene-2,3-dicarboxylic acid; tricarboxylic acids, such as trimellitic acid, trimesic acid, and diphenyl ether tricarboxylic acid; active ester compounds produced via a reaction of one carboxyl group of a dicarboxylic acid, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene, with N-hydroxybenzotriazole, imidazole, or N-hydroxy-5-norbornene-2,3-dicarboximide, and compounds in which a part of hydrogen atoms of an aromatic ring or hydrocarbon thereof is substituted by an alkyl group or fluoroalkyl group having 1 to 10 carbon atoms, a halogen atom, or the like.

The end blocking agent which can be used in the present invention can be easily detected by the following methods. For example, the end blocking agent used in the present invention can be easily detected by dissolving, in an acidic solution, the resin (a) into which the end blocking agent has been introduced to allow the resin to decompose into an amine component and an acid anhydride component which are the constitutional units of the resin, followed by gas chromatography (GC) or NMR. Apart from this, the resin component into which the end blocking agent has been introduced can also be easily detected by directly analyzing by thermal decomposition gas chromatography (PGC), infrared spectroscopy and $^{13}$C-NMR spectroscopy.

In the present invention, the resin (a) is synthesized, for example, without limitation, by the following method.

The polyamide structure is formed by first dissolving a compound in which a dicarboxylic acid is substituted by an active carboxylic acid group, a diamine having an aliphatic group, and other copolymerization components in an organic solvent at room temperature or, in some cases, at a raised temperature, followed by heat polymerization. From the viewpoint of the stability of the solution during the reaction, the diamine compound which is highly soluble is preferably dissolved in advance. In the case of copolymerizing with the polyimide precursor or the polyimide, an acid dianhydride, in some cases, and other copolymerization components are subsequently added, and an acid as an end blocking agent, or an acid anhydride is then added for polymerization.

When the diamine having an aliphatic group is introduced, the reaction of the compound in which a dicarboxylic acid is substituted by an active carboxylic acid group with the diamine compound is preferably carried out at 70 to 200° C.

The polyimide precursor structure is a structure derived from an acid anhydride in the above-mentioned polymerization method, and in the case of an amic acid ester, the structure can be obtained by reacting a carboxylic acid with an esterification agent after the above-mentioned polymerization.

The polyimide to be used in the present invention can be synthesized utilizing, for example, a method in which an imide precursor is obtained by using a method for producing a structure represented by the general formula (2), followed by polymerization at 70 to 200° C.; a method in which imide rings of imide precursors are all closed using a known imidization reaction; a method in which an imide structure is partially introduced by stopping an imidization reaction in the middle; or a method in which an imide structure is partially introduced by mixing a cyclized imide polymer in which imide rings of imide precursors are all closed with the polyimide precursor.

The benzoxazole structure to be used for the present invention can be synthesized, for example, by utilizing a method that involves obtaining a polyamide and polymerizing it at 150 to 250° C., or a method of closing a ring by adding an acidic catalyst. Examples of the organic solvent to be used for the polymerization of resins include, but are not limited to, amides such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyramide, and methoxy-N,N-dimethylpropionamide; cyclic esters such as γ-butyrolactone, γ-valerolactone, δ-valerolactone, γ-caprolactone, ε-caprolactone, and α-methyl-γ-butyrolactone; carbonates such as ethylene carbonate, and propylene carbonate; glycols, such as triethylene glycol; phenols such as m-cresol and p-cresol; acetophenone, 1,3-dimethyl-2-imidazolidinone, sulfolane, dimethylsulfoxide, tetrahydrofuran, dimethylsufoxide, propylene glycol monomethyl ether acetate, and ethyl lactate.

In the present invention, it is preferable that the resin (a) be isolated by polymerizing the resin (a) through the above-described method, then adding the resin (a) into a plenty of water or a mixture of methanol and water to precipitate the resin (a), and collecting the resin (a) through filtration, and then drying the resin (a). The drying temperature is preferably 40 to 100° C., and more preferably 50 to 80° C. Through this operation, unreacted monomers or oligomeric components such as a dimer and a trimer are removed, so that the film properties after heat-curing can be enhanced.

The imidization degree in the present invention can be easily determined by the following method, for example. An infrared absorption spectrum of a polymer is first measured, and the presence of absorption peaks of an imide structure arising from a polyimide (around 1780 cm$^{-1}$, and around 1377 cm$^{-1}$) is confirmed. Next, the imidization degree of the polymer that has been heat-treated at 350° C. for 1 hour is measured as a 100% sample by infrared absorption spectroscopy, and the content of imide groups in the resin before the heat-treatment is calculated by comparing peak intensities around 1377 cm$^{-1}$ of the resin between before and after the heat-treatment to determine the imidization degree. The imidization degree is preferably 50% or more, and more preferably 80% or more because change in ring closure ratio in heat-curing is suppressed and the effect of lowering stress can be achieved.

The resin composition of the present invention can be used as a positive-working resin composition due to the condition that the resin (a) is an alkali-soluble resin having a phenolic hydroxyl group and the naphthoquinonediazide compound (c) is contained. A resin composition obtained including a naphthoquinonediazide compound that generates an acid by the action of light, namely, a photoacid generator, is of a positive-working type, which is solubilized by light. Use of a naphthoquinonediazide compound is preferable because this makes it possible to obtain finer patterns than non-photosensitive resin compositions which are to be etched with positive-working photoresists or negative types which are to be insolubilized through reaction with resin or crosslinking agents by the action of light.

Examples of the naphthoquinonediazide compound include a polyhydroxy compound to which a sulfonic acid group of a quinonediazide is ester-bonded, a polyamino compound to which a sulfonic acid group of a quinonediazide is sulfonamide-bonded, a polyhydroxypolyamino compound to which a sulfonic acid group of a quinonediazide is ester-bonded and/or sulfonamide-bonded. Not all the functional groups of the polyhydroxy compound, polyamino compound, and polyhydroxypolyamino compound may be substituted by quinonediazide, but 40% by mole or more of the total functional groups on average are preferably substituted by quinonediazide. By the inclusion of such a quinonediazide compound, there can be obtained a positive-working photosensitive resin composition which is sensitive to i-line (wavelength: 365 nm), h-line (wavelength: 405 nm), and g-line (wavelength 436 nm) radiation from a mercury lamp which is general ultraviolet rays.

Specific examples of the polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, Methylenetris-FR-CR, BisRS-26X, DML-MBPC, DML-MBOC, DML- OCHP, DML-PCHP, DML-PC, DML-PTBP, DML-34X, DML-EP, DML-POP, Dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (the foregoing are trade names and are produced by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (the foregoing are trade names and produced by Asahi Yukizai Corporation), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, BisP-AP (trade name, produced by Honshu Chemical Industry Co., Ltd.), and novolac resin.

Specific examples of the polyamino compound may include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenyl sulfide.

Specific examples of the polyhydroxypolyamino compound may include, but are not limited to, 2,2-bis(3-amino-4-hydroxyphenyl)hexafluoropropane and 3,3'-dihydroxybenzidine.

Among naphthoquinonediazide compounds, esters of polyhydroxy compounds with sulfonic acids of quinonediazides are preferred. This results in high sensitivity to i-line exposure and a higher resolution.

The content of the naphthoquinonediazide compound (c) that can be used in the resin composition of the present invention is preferably 1 to 50 parts by mass, more preferably 10 to 40 parts by mass, based on 100 parts by mass of the resin (a) which is an alkali-soluble resin having a phenolic hydroxyl group. It is preferable to adjust the content of the naphthoquinonediazide compound (c) to that range because high contrast between exposed and unexposed portions is thereby obtained, so that an increased sensitivity can be achieved and no residue, which is generated when the content is large, is observed. Further, a sensitizer, etc. may be added as required.

The resin composition of the present invention includes the antioxidizing agent (b). While the antioxidizing agent (b) is an antioxidizing substance to be added to suppress oxidation, the antioxidizing agent (b) means, in the present invention, one having no crosslinking groups. Because of having no crosslinking groups, the antioxidizing agent (b) can act rot only on sites to which crosslinking groups can react but also on the whole film.

The content of the antioxidizing agent (b) based on 100 parts by mass of the resin (a) is preferably in the range of 0.1 to 10 parts by mass. When the addition amount is more than 0.1 parts by mass, an effect of improving extension characteristics after reliability evaluation and adhesion to metal materials can be obtained. On the other hand, when the addition amount is less than 10 parts by mass, the agent does not remain as a residue at the time of development along with improvement of adhesion, so that no decrease in resolution or no deterioration in thermal properties occurs. More preferably, the addition amount of the antioxidizing agent (b) containing the compound represented by the general formula (1) is 0.2 to 5 parts by mass based on the resin (a).

By the inclusion of the antioxidizing agent (b), hydrolysis or water absorption of the resin (a), decomposition of phenolic hydroxyl groups or aliphatic groups, and diffusion of an acid by the action of the photosensitizer can be suppressed, so that shrinkage of the cured film of the resin composition is suppressed and uniformity in film thickness and pattern in-plane as well as high extension even after reliability evaluation can be obtained. Furthermore, by the inclusion of the antioxidizing agent (b), peeling off of the cured film from metal wirings after reliability evaluation or cohesive peeling between the metal layer and the metal oxide layer of the metal wirings can be suppressed. On the outermost surface of the metal wiring is formed a metal oxide layer that is generated as a result of the oxidation of the metal wiring by oxygen, acid or moisture through reliability evaluation such as high temperature holding test, constant temperature high humidity test, thermal cycle test, or the like. When the cured film of the resin composition is in contact with a metal substrate, oxygen permeation is suppressed, so that the formation of a metal oxide layer is somewhat suppressed, but the formation of the metal oxide layer progresses gradually because the naphthoquinonediazide compound in the cured film is decomposed to generate an acid during reliability evaluation. As a result, peeling off of the cured film from the metal layer or the metal oxide layer, or peeling off of the metal oxide layer from the metal layer occurs. Since the antioxidizing agent can suppress the formation of the metal oxide layer by capturing the generated acid, a cured film having high adhesion to metal wirings even after reliability evaluation can be obtained.

Examples of the antioxidizing agent (b) to be used in the present invention include antioxidizing agents having a benzotriazole, organophosphorus, and hindered phenol structure. Among these, antioxidizing agents having a hindered phenol structure are preferable because they are superior in solubility at the time of development and storage stability and, therefore, they can afford resin compositions being uniform in in-plane film thickness/pattern as well as high in resolution.

Specific examples of the antioxidizing agents having a benzotriazole structure include, but are not limited to, 1,2,3-benzotriazole (1H-benzotriazole), sodium salt of 1H-benzotriazole, 4-methyl-1H-benzotriazole, 5-methyl-1H-benzotriazole, tolyltriazole (a mixture of 4-methyl-1H-benzotriazole and 5-methyl-1H-benzotriazole), potassium salt of 4-methyl-1H-benzotriazole, potassium salt of 5-methyl-1H-benzotriazole, amine salt of 4-methyl-1H-benzotriazole, amine salt of 5-methyl-1H-benzotriazole, 2-(3,5-di-t-butyl-2-hydroxyphenyl)-5-chlorobenzotriazole, and 2-(3,5-di-t-amyl-2-hydroxyphenyl)benzotriazole.

Specific examples of the antioxidizing agent having organophosphorus include, but are not limited to, tris(2,4-di-tert-butylphenyl)phosphite, 3,9-di(2,4-di-tert-butylphenoxy)-2,4,8,10-tetraoxa-3,9-diphosphaspiro[5.5]undecane, 3,9-di(2,4-dicumylphenoxy)-2,4,8,10-tetraoxa-3,9-diphosphaspiro[5.5]undecane, tris(p-nonylphenyl)phosphite, 2,2', 2"-nitrilo[triethyl-tris[3,3',5,5'-tetra-tert-butyl-1,1'-biphenyl-2'-diyl]phosphite], 3,9-distearyloxy-2,4,8,10-tetraoxa-3,9-diphosphaspiro[5.5]undecane, dilaurylphosphite, 3,9-di[2,6-di-tert-butyl-4-methylphenoxy]-2,4,8,10-tetraoxa-3,9-diphosphaspiro[5.5]undecane, tetrakis(2,4-di-tert-butylphenyl)4,4'-bis(diphenylene)phosphonite, distearylpentaerythritoldiphosphite, diisodecylpentaerythritoldiphosphite, 2,4,6-tri-tert-butylphenyl-2-butyl-2-ethyl-1,3-propanediolphosphite, tristearylsorbitoltriphosphite, tetrakis(2,4-di-tert-butylphenyl) 4,4'-biphenylenediphosphonite, (2,4,6-tri-tert-butylphenyl)-2-butyl-2-ethyl-1,3-propanediolphosphite, and tri-isodecylphosphite.

Examples of the antioxidizing agent having a hindered phenol structure include, but are not limited to, 2,6-di-tert-butyl-4-(4,6-bis(octylthio)-1,3,5-triazin-2-ylamino)phenol, mono-t-butyl-p-cresol, mono-t-butyl-m-cresol, 4-t-butylcatechol, 2,5-di-t-butylhydroquinone, 2,5-di-t-amylhydroquinone, propyl gallate, 4,4'-methylenebis(2,6-t-butylphenol), 4,4'-isopropylidenebis(2,6-di-t-butylphenol), 4,4'-butylidenebis(3-methyl-6-t-butylphenol), butylhydroxyanisole, 2,6-di-t-butyl-p-cresol, 2,6-di-t-butylphenol, 2,6-di-t-butyl-4-ethylphenol, 2,4,6-tri-t-butylphenol, 4-hydroxymethyl-2,6-di-t-butyl, octadecyl-3-(4-hydroxy-3',5'-di-t-butylphenyl) propionate, distearyl (4-hydroxy-3-methyl-5-t-butyl)benzyl-malonate, 6-(4-hydroxy-3,5-di-t-butylanilino)2,4-bisoctyl-thio-1,3,5-triazine, 2,6-diphenyl-4-octadecanoxyphenol, 2,2'-methylenebis(4-methyl-6-t-butylphenol), 2,2'-methylenebis(4-ethyl-6-t-butylphenol), 2,2'-isobutylidenebis(4,6-dimethylphenol), 2,2'-dihydroxy-3,3'-di-(α-methylcyclohexyl)-5,5'-dimethyldiphenylmethane, 2,2'-methylenebis(4-methyl-6-cyclohexylphenol), tris[β-(3,5-di-t-butyl-4-hydroxyphenyl)propionyloxyethyl]isocyanurate, 1,3,5-tris (2,6-dimethyl-3-hydroxy-4-t-butylbenzyl) isocyanurate, tris (3,5-di-t-butyl-4-hydroxyphenol) isocyanurate, 1,1,3'-tris(2-methyl-4-hydroxy-5-t-butylphenyl)butane, 2,6-bis(2'-hydroxy-3'-t-butyl-5'-methylbehzyl) 4-methylphenol, N,N'-hexamethylenebis(3,5-di-t-butyl-4-hydroxyhydrocinnamate), hexamethyleneglycol bis[β-(3,5-di-t-butyl-4-hydroxyphenyl) propionate], 2',3-bis[[3-[3,5-di-tert-butyl-4-hydroxyphenyl]propionyl]] propionohydrazide, triethylene glycol bis[β-(3-t-butyl-5-methyl-4-hydroxyphenyl) propionate, tetrakis[methylene-3-(3,5-di-t-butyl-4-hydroxyphenyl)propionate]methane, 1,3, 5-tris[(4-tert-butyl-3-hydroxy-2,6-xylyl)methyl]-1,3,5-triazine-2,4,6(1H,3H,5H)-trione, 1,3,5,-tris(3,5-di-tert-butyl-4-hydroxybenzyl)-1,3,5-triazine-2,4,6(1H,3H,5H)-trione. These may be used singly or two or more of them may be used in combination.

Among the antioxidizing agents having a hindered phenol structure, an antioxidizing agent containing the compound represented by the following general formula (1) can suppress shrinkage of the cured film, and therefore, in-plane uniformity in film thickness and pattern as well as the extension characteristics of the cured film after reliability evaluation or adhesion to metal materials are improved.

[Chemical Formula 15]

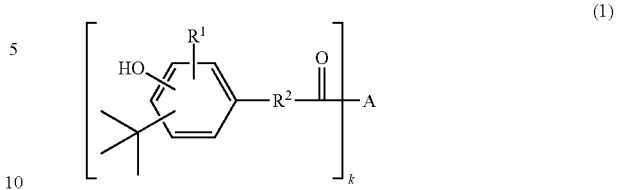

In the general formula (1), $R^1$ represents a hydrogen atom or an alkyl group having 2 or more carbon atoms, and $R^2$ represents an alkylene group having 2 or more carbon atoms. A represents a monovalent to tetravalent organic group containing at least one of an alkylene group having 2 or more carbon atoms, an O atom, and an N atom; and k represents an integer of 1 to 4. Since the compound represented by the general formula (1) has a flexible alkylene group as $R^2$, the hindered phenol structure can move flexibly, and therefore, the oxidative degradation of the whole cured film can be easily suppressed. In addition, metal oxidation of the metal material can be suppressed by the rust prevention effect on the metal materials. In addition, the case where $R^2$ has a flexible alkylene group is also preferable from the viewpoint that in-plane film thickness uniformity at the time of coating can be improved.

Furthermore, the case where k is an integer of 2 to 4 in the general formula (1) is more preferable because both the resin composition and the metal material will receive action. Examples of A include alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, —O—, —NH—, —NHNH—, and any combinations thereof, and they optionally have a substituent.

Particularly, A preferably contains alkyl ether or —NH— from the viewpoint of solubility in the developing solution and adhesion to metals, and A more preferably contains —NH— from the viewpoint of the interaction with the resin (a) and the adhesion to metals by the formation of a metal complex.

Examples of the compound represented by the general formula (1) include, but are not limited to, the following structures.

[Chemical Formula 16]

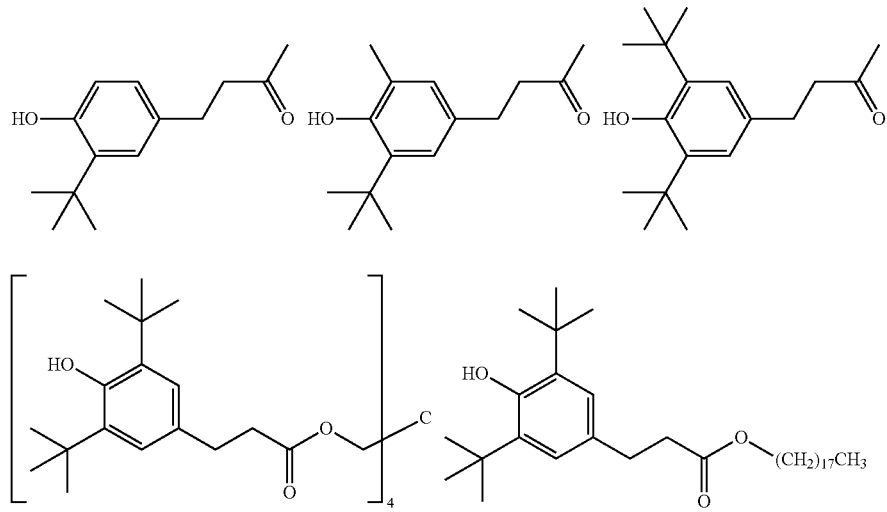

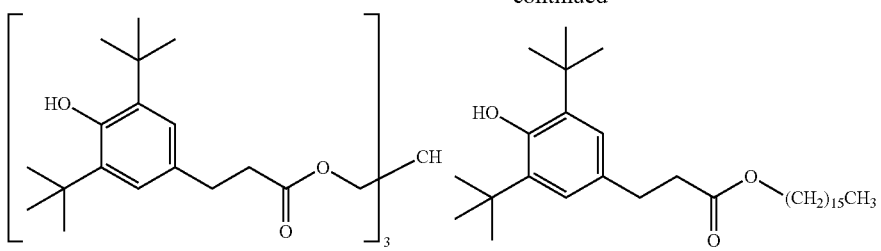
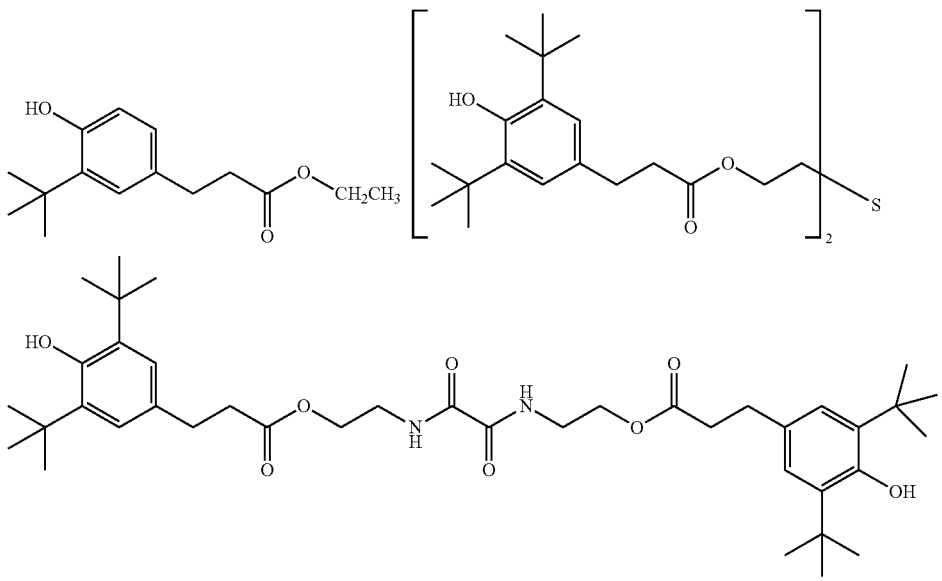
[Chemical Formula 17]
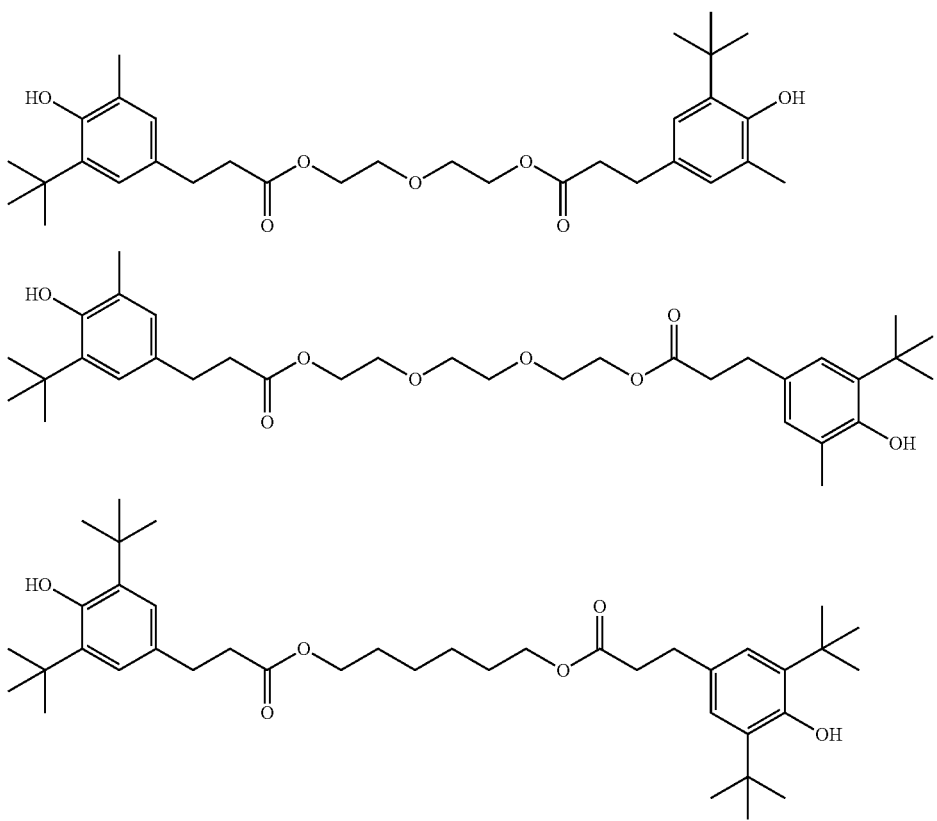

-continued
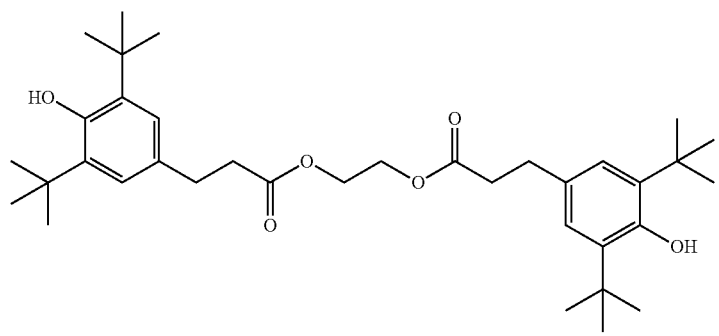
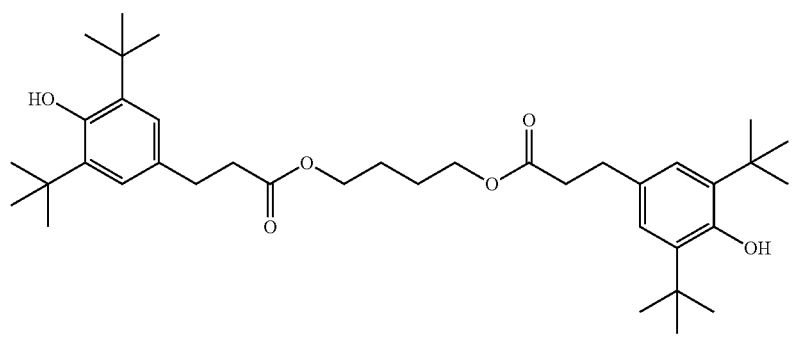
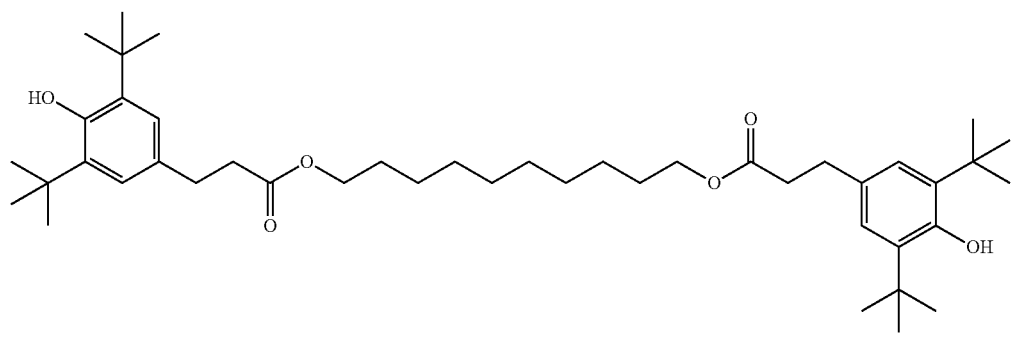
[Chemical Formula 18]
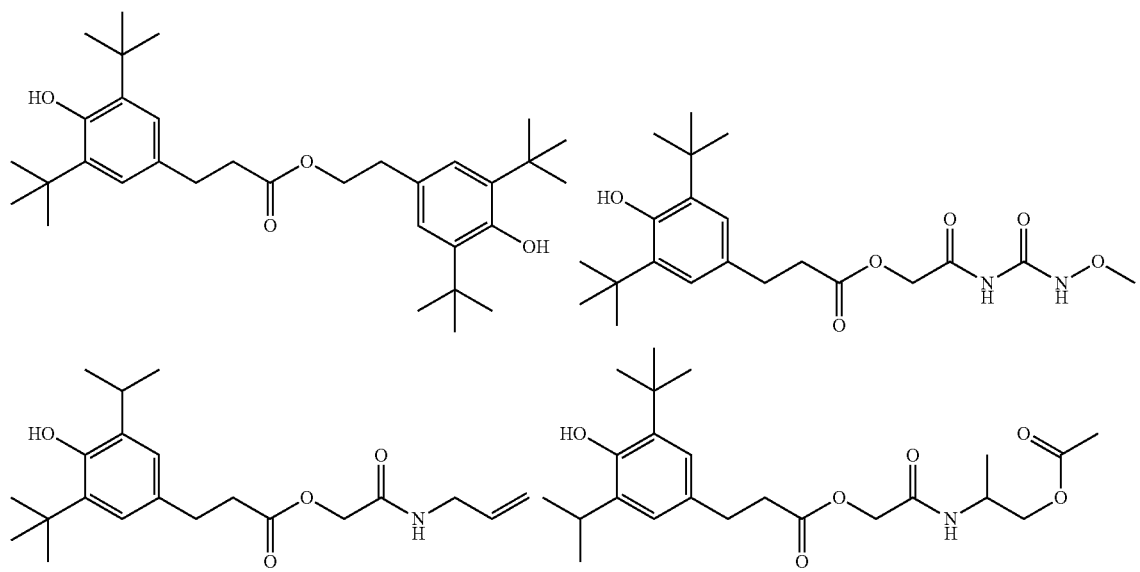

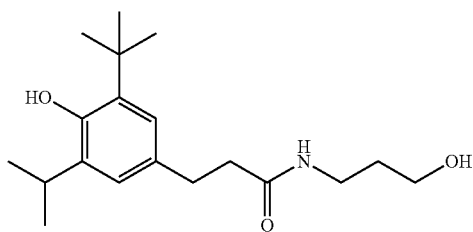
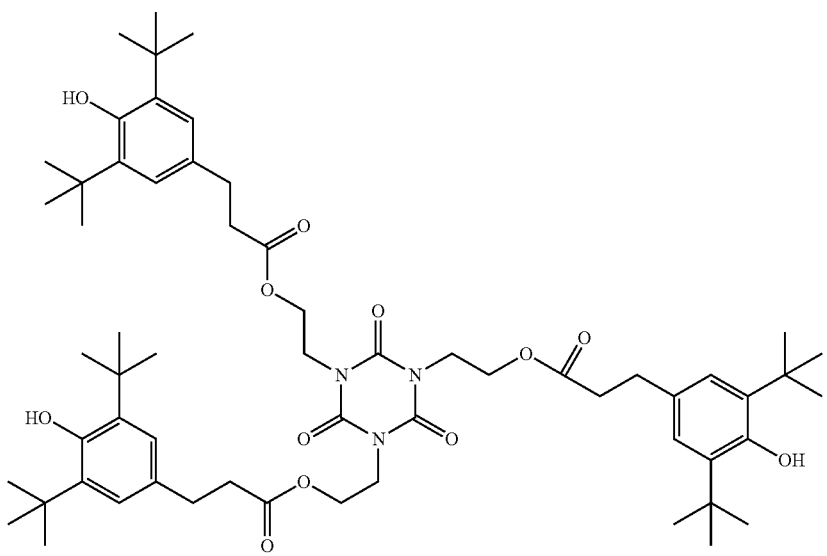
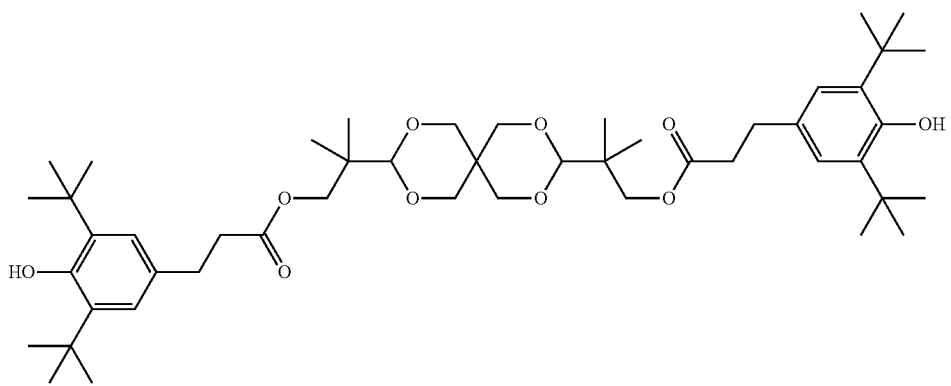
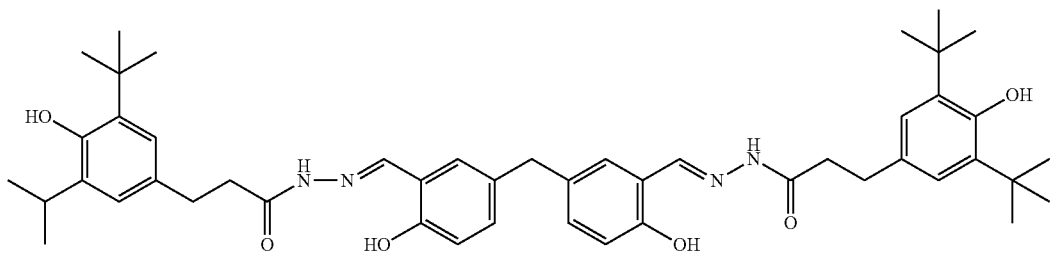

[Chemical Formula 19]
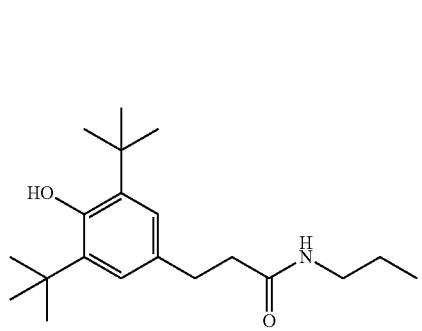
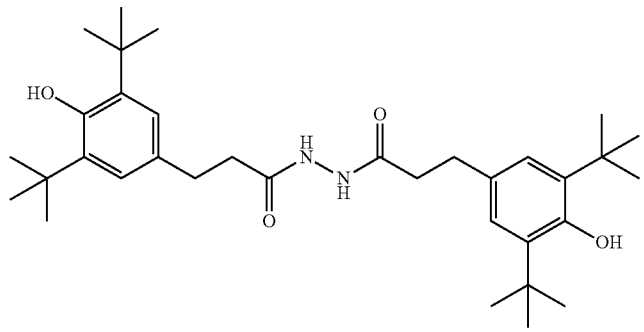
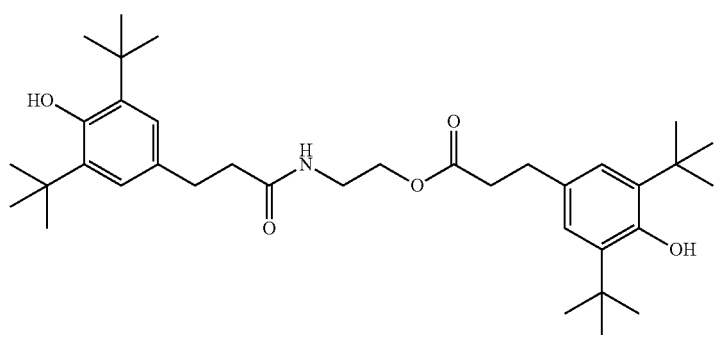
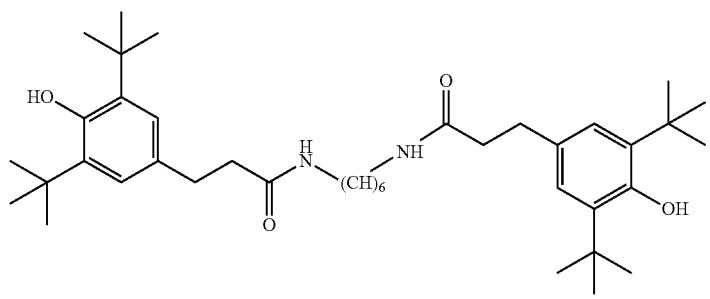
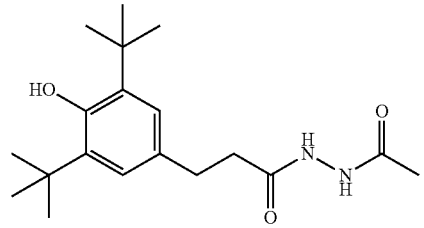
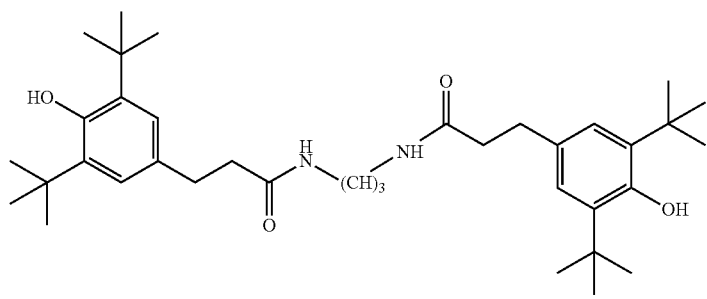
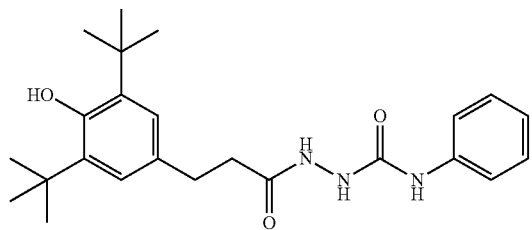

-continued

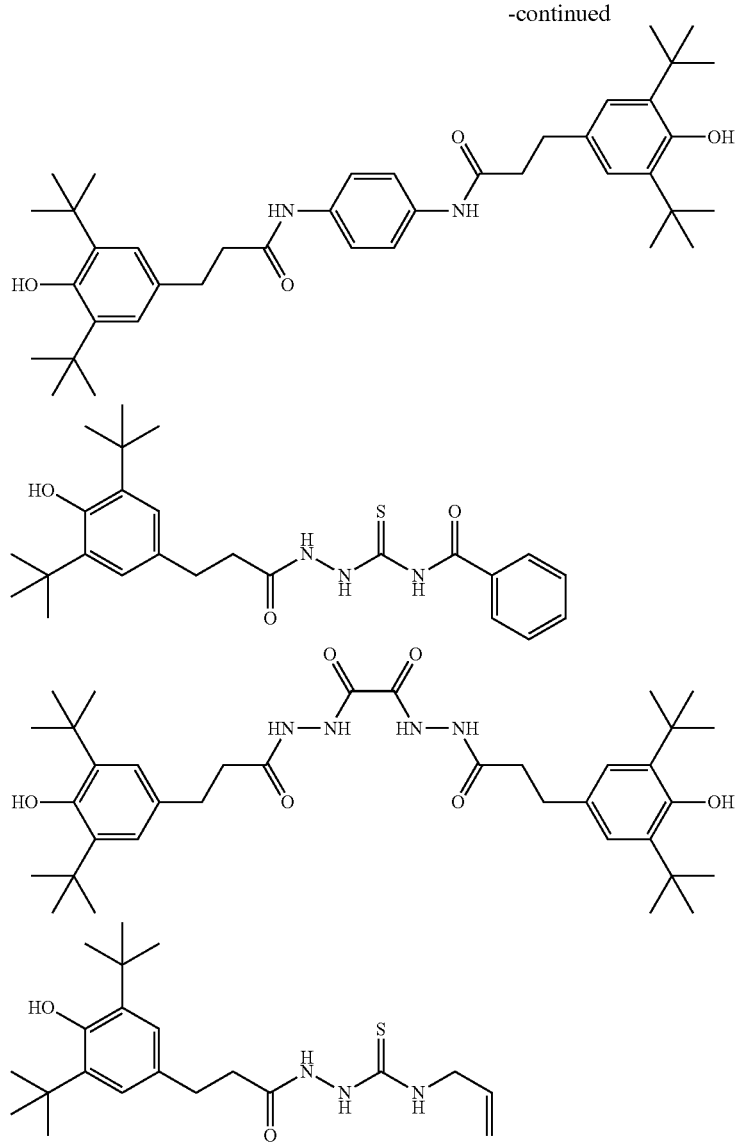

The resin composition of the present invention is a resin composition containing the crosslinking agent (d), wherein the crosslinking agent (d) has a phenolic hydroxyl group in one molecule thereof and has substituents each with a molecular weight of 40 or more at both ortho positions to the phenolic hydroxyl group. The term "crosslinking agent" means any material having a crosslinkable group, which is a functional group capable of crosslinking through radical reaction, addition reaction, condensation reaction, or the like.

By the inclusion of the crosslinking agent, oxidative degradation can be suppressed by improving film density (suppressing oxygen permeation, suppressing metal diffusion).

Since in the crosslinking agent (d), a bulky structure having a molecular weight of 40 or more is adjacent to a phenolic hydroxyl group, a dense film having a high crosslinking density can be obtained at the time of curing. Therefore, oxygen permeation of the cured film or diffusion of metal into the cured film is suppressed and oxidative deterioration of resin or corrosion of metal can be effectively suppressed, so that, extension characteristics of cured films or adhesion to metal materials is improved after reliability evaluation.

By the inclusion of the crosslinking agent, oxidative degradation can be suppressed by preventing oxidation.

When the bulky structure having a molecular weight of 40 or more is adjacent to the phenolic hydroxyl group, the same effect as an antioxidizing agent having a hindered phenol structure can be exhibited. Therefore, an effect of preventing oxidative degradation can be obtained also at dense crosslinked sites, to which the antioxidizing agent (b) alone is difficult to be adjacent. Therefore, in addition to the inherent function as a crosslinking agent, a rust prevention effect on metal materials can suppress oxidation of metal as well as oxidative deterioration of the sites where crosslinking agents have crosslinked and oxidative degradation of aliphatic groups or phenolic hydroxyl groups of the resin (a) around the crosslinked sites. However, because of being a crosslinking agent, the crosslinking agent (d) tends to be unevenly distributed at sites where crosslinking groups can react in a film, so that a high effect of suppressing oxidative degradation is obtained around the crosslinked portions. However, in order to obtain the effect of preventing oxidation, a combination with the antioxidizing agent (b) is indispensable.

As described above, oxidative degradation and corrosion of metal can be effectively suppressed by the action of the antioxidizing agent (b) to the whole of the cured film, the suppression of oxygen permeability by increasing the film density with the crosslinking agent (d), and the action of the antioxidizing structure of the crosslinking agent (d) to around crosslinked sites. In addition, the crosslinking agent (d) crosslinks with ring-unclosed portions of the resin at the time of heat-curing and, as a result, can suppress film thickness and pattern shrinkage caused by rapid ring closure of the resin, so that good in-plane uniformity in film thickness and pattern can be obtained in the cured film.

As the substituents with a molecular weight of 40 or more, an isopropyl group, a t-butyl group, and an alkoxymethyl group are preferable. Among them, an alkoxymethyl group is preferable because it serves as a crosslinking group and it remains even after curing when the curing is performed at a low temperature, so that it prevents oxidation during a reliability evaluation.

Examples of the crosslinking agent (d) include, but are not limited to, the following structures.

[Chemical Formula 20]

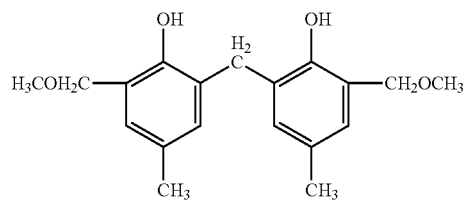
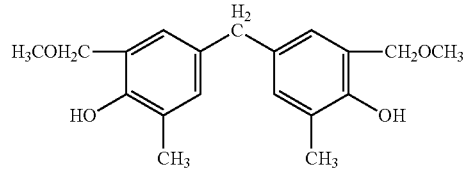
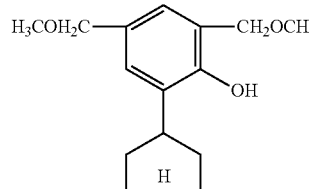
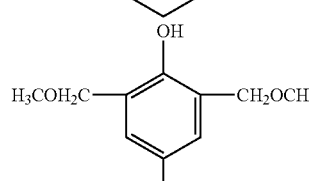
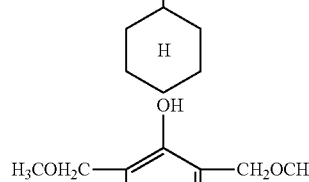
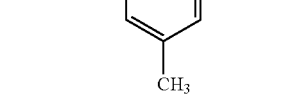

-continued

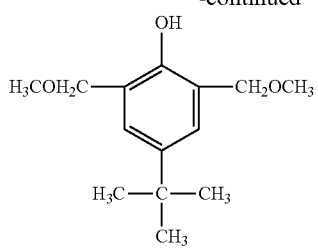
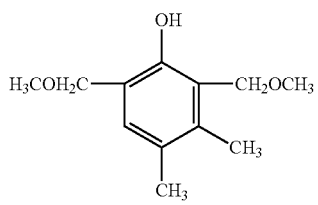
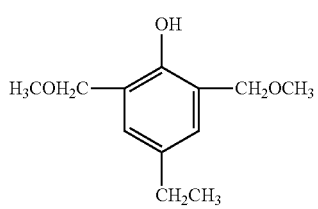
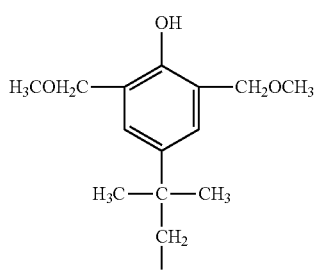
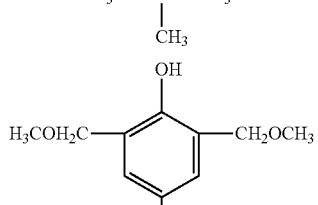
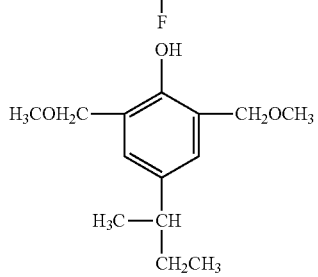
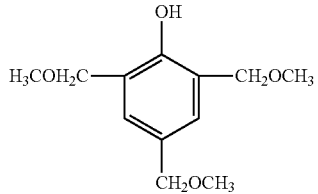

-continued

[Chemical Formula 21]

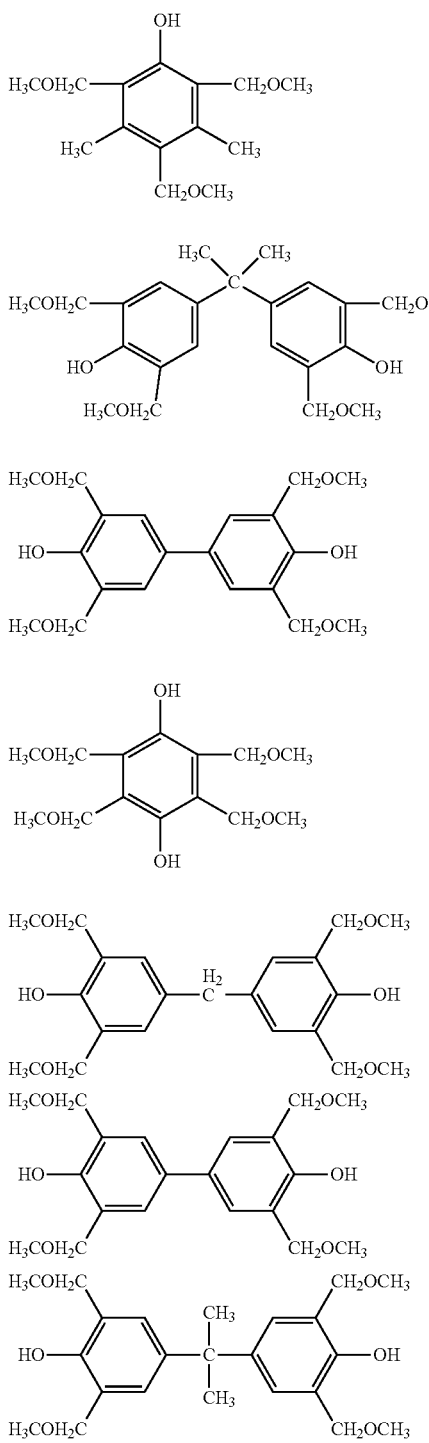

[Chemical Formula 22]

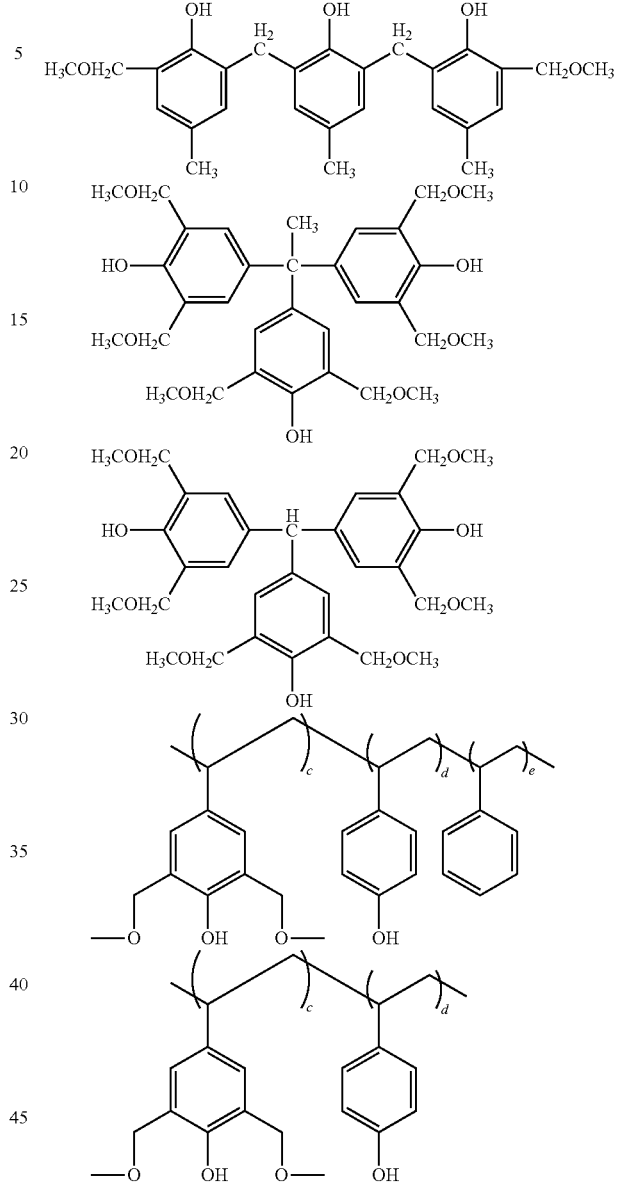

wherein c, d and e each represent an integer of 1 or more, and preferably $3 \leq c \leq 20$, $1 \leq d \leq 30$ and $1 \leq c \leq 30$.

Preferably, the content of the crosslinking agent (d) based on 100 parts by mass of the resin (a) is in a range of 15 to 70 parts by mass. When the content is 15 parts by mass or more, effects of increasing the density of the cured film and preventing oxidation can be obtained and the reduction in extension after reliability evaluation can be significantly suppressed. When the content is 70 parts by mass or less, an effect of improving the extension of the cured film can be obtained, cracks in the film can be reduced, and adhesion to metal wirings can also be improved.

The resin composition of the present invention may contain a heat-crosslinking agent other than (d). Specifically, a compound having at least two alkoxymethyl groups or methylol groups is preferable. The inclusion of at least two of these groups can provide a cross-linked structure formed through condensation reaction of the resin and a homolo- Further, it is preferable that the crosslinking agent (d) is a crosslinking agent having three or more phenolic hydroxyl groups in one molecule thereof. With three or more phenolic hydroxyl groups, which have an antioxidation effect, the crosslinking agent can effectively act on both the resin (a) and metal and can impart characteristics after evaluation of reliability. Such preferable examples include, but are not limited to, the following structures.

gous molecule. The combination with a photo acid generator can provide a wider range of designs for improving the sensitivity or the mechanical properties of the cured film.

Preferred examples of such other heat-crosslinking agents include MX-290, NIKALAC MX-280, NIKALAC MX-270, NIKALAC MX-279, NIKALAC MW-100LM and NIKALAC MX-750LM (which are trade names, produced by Sanwa Chemical Co., Ltd.). Two or more of them may be used.

Preferably, the resin composition of the present invention contains a compound (e) represented by the general formula (3). The inclusion of the compound (e) represented by the general formula (3) significantly enhances adhesion of a heat-cured film to a metal material, especially copper.

[Chemical Formula 23]

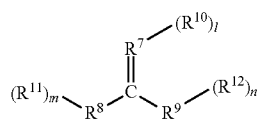

(3)

This is attributed to the interaction of S atom or N atom in the compound represented by the general formula (3) with the metal surface, and furthermore to the conformation which promotes the interaction with the metal surface. These effects can impart photosensitivity to the resin composition, and afford a cured resin film having superior adhesion to a metal material even when the composition contains an additive. In the general formula (3), $R^7$ to $R^9$ represent any of an O atom, an S atom, or an N atom, and at least one of $R^7$ to $R^9$ represents an S atom. l represents 0 or 1, and m and n represent an integer of 0 to 2; $R^{10}$ to $R^{12}$ each independently represent a hydrogen atom or an organic group having 1 to 20 carbon atoms. Examples of $R^{10}$ to $R^{12}$ include hydrogen atom, alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, and combinations thereof, and may have a substituent.

The addition amount of the compound represented by the general formula (3) is preferably 0.1 to 15 parts by mass, and more preferably 0.5 to 15 parts by mass, based on the resin (a). When the addition amount is less than 0.1 parts by mass, it is difficult to obtain an effect of enhancing adhesion to a metal material, and when the addition amount is more than 15 parts by mass, the interaction with a photosensitizer may unfavorably reduce the sensitivity of the resin composition.

In the compound represented by the general formula (3) to be used in the present invention, $R^7$ to $R^9$ represent any of an O atom, an S atom, or an N atom, and at least one of $R^7$ to $R^9$ is preferably an S atom. In general, when a compound containing an N atom is added, sensitivity may be impaired through the interaction between the photosensitizer and the compound containing an N atom, but when the compound represented by the general formula (3) contains an S atom, the interaction effect is suitably maintained, and the effect of enhancing adhesion can be obtained without lowering the sensitivity. Furthermore, it is more preferable that the compound contain a trialkoxymethyl group from the viewpoint of the adhesion to substrates other than metals.

Examples of the compound represented by the general formula (3) include, but are not limited to, the following structures.

[Chemical Formula 24]

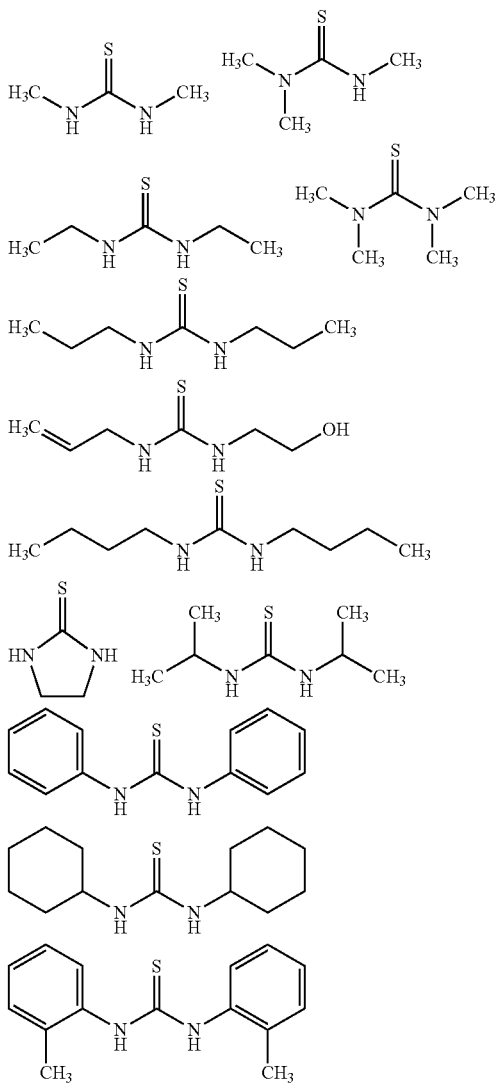

[Chemical Formula 25]

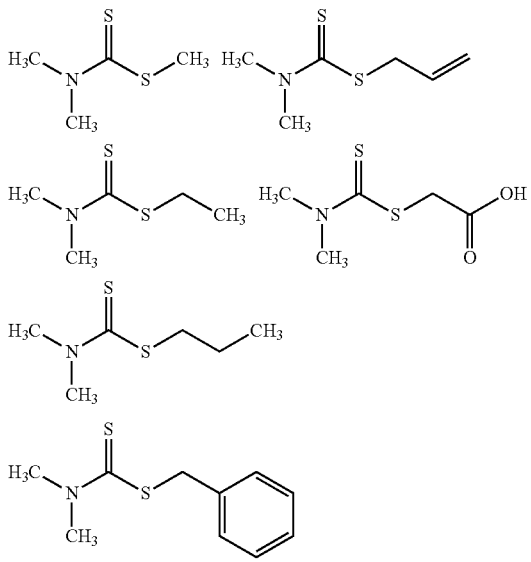

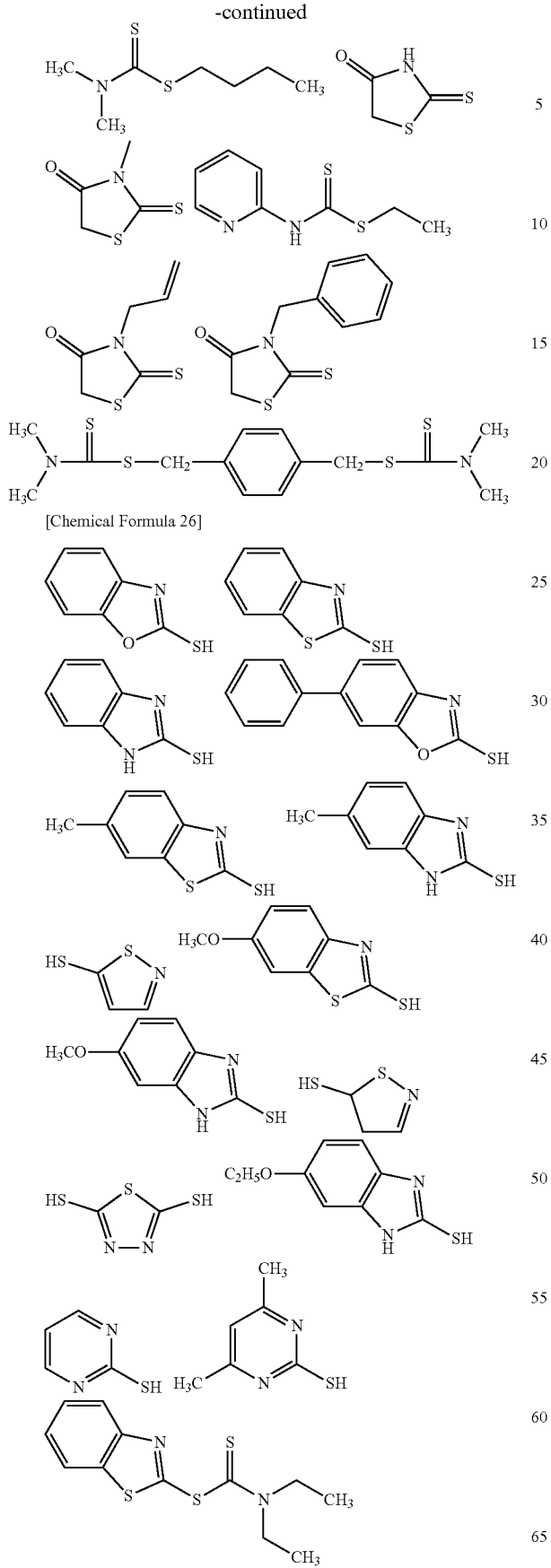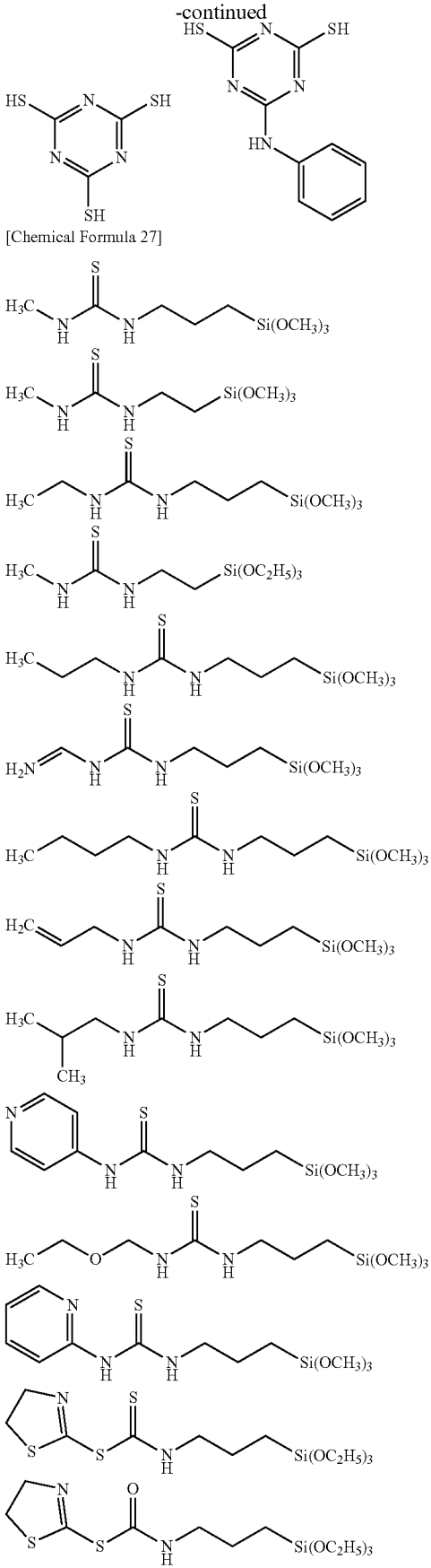

[Chemical Formula 28]

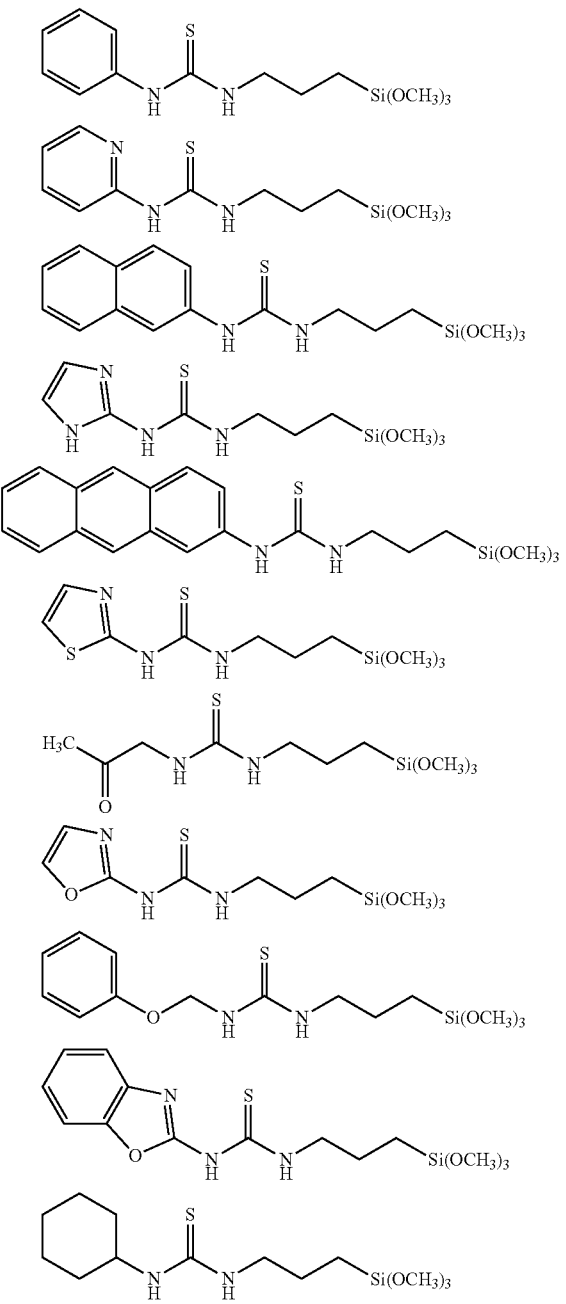

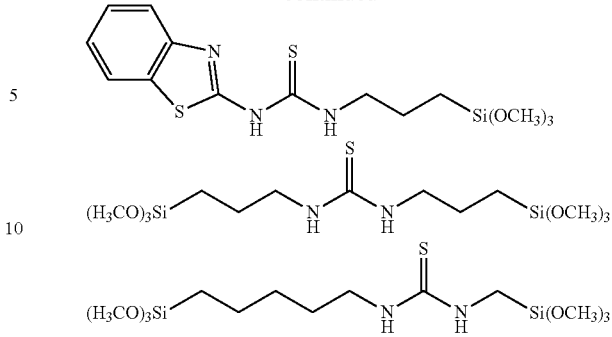

When the resin composition of the present invention contains a heat-crosslinking agent (f) having a structural unit represented by the following general formula (4), it is possible to further enhance extension and reduce stress.

[Chemical Formula 29]

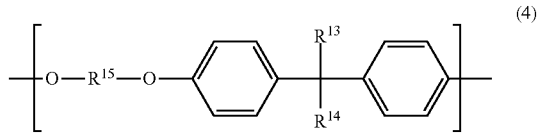

(4)

In the general formula (4), $R^{13}$ and $R^{14}$ each independently represent a hydrogen atom or a methyl group. $R^{15}$ is a divalent organic group including an alkylene group having two or more carbon atoms, and may be linear, branched, or cyclic. Examples of $R^{15}$ include alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, and any combinations thereof, and they may have a substituent.

It is possible to enhance extension and reduce stress while exhibiting heat resistance because the heat-crosslinking agent itself has an alkylene group, which is flexible, and an aromatic group, which is rigid. Examples of the crosslinking group include, but are not limited to, acrylic group, methylol group, alkoxymethyl group, and epoxy group. Among these, an epoxy group is preferable from the viewpoint that it can react with a phenolic hydroxyl group of the resin (a) to improve the heat resistance of the cured film and that it can react without undergoing dehydration. This makes it possible to improve in-plane uniformity due to further reduction in shrinkage.

Examples of the compound represented by the general formula (4) include, but are not limited to, the following structures.

[Chemical Formula 30]

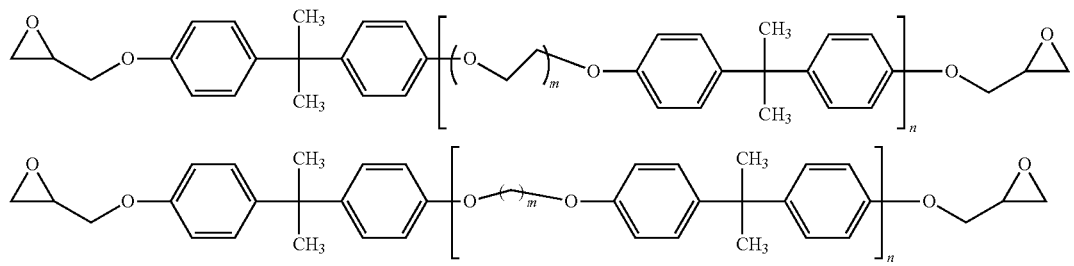

-continued

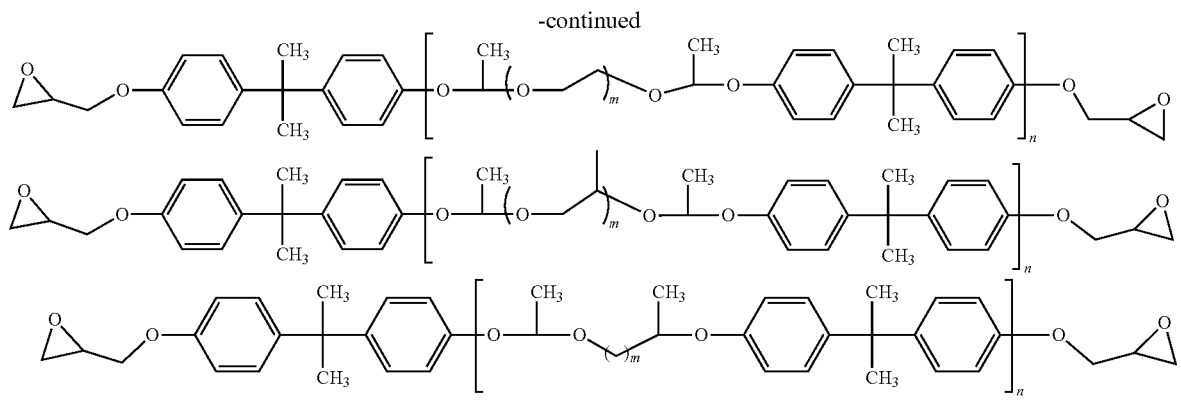

wherein n is an integer of 1 to 5, and m is an integer of 1 to 20.

Among the structures described above, it is preferable that n be 1 to 2 and m be 3 to 7 from the viewpoint of enhancing both heat resistance and extension.

The addition amount of the compound represented by the general formula (4) is preferably 2 to 35 parts by mass, more preferably 5 to 25 parts by mass based on the resin (a). When the addition amount is less than 2 parts by mass, it is difficult to obtain an effect of enhancing extension and reducing stress, and when the addition amount is more than 35 parts by mass, the sensitivity of the resin composition may be unfavorably reduced.

When the content of the compound represented by the general formula (1) is in the range of 10 parts by mass to 50 parts by mass based on 100 parts by mass of the heat-crosslinking agent having a structural unit represented by the general formula (4), the extension characteristics of the cured film after reliability evaluation can be significantly enhanced. When the content is in this range, crosslinking of the heat-crosslinking agent having a structural unit represented by the general formula (4) is promoted in the cured film to suppress deterioration of an alkylene group after a reliability evaluation. In addition, the resin composition of the present invention may contain a low molecular weight compound having a phenolic hydroxyl group, if necessary, as long as a shrinkage residual film rate after curing is not decreased. This can shorten the developing time.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylene Tris-FR-CR, and BisRS-26X (which are trade names; produced by Honshu Chemical Industry Co., Ltd.); and BIP-PC, BIR-PC, BIRPTBP, and BIR-BIPC-F (which are trade names; produced by Asahi Yukizai Corporation). Two or more of them may be used.

The content of the low molecular weight compound having a phenolic hydroxyl group is preferably 1 to 40 parts by mass based on 100 parts by mass of the resin (a).

Preferably, the resin composition of the present invention includes a solvent. Examples of the solvent include polar aprotic solvents, such as N-methyl-2-pyrrolidone, γ-butyrolactone, γ-valerolactone, δ-valerolactone, N,N-dimethylformamide, N,N-dimethylacetamide, dimethylsulfoxide, 1,3-dimethyl-2-imidazolidinone, N,N'-dimethylpropyleneurea, N,N-dimethylisobutyramide, and methoxy-N,N-dimethylpropionamide; ethers, such as tetrahydrofuran, dioxane, propylene glycol monomethyl ether, and propylene glycol monoethyl ether; ketones, such as acetone, methyl ethyl ketone, and diisobutyl ketone; esters, such as ethyl acetate, butyl acetate, isobutyl acetate, propyl acetate, propylene glycol monomethyl ether acetate, and 3-methyl-3-methoxybutyl acetate; alcohols, such as ethyl lactate, methyl lactate, diacetone alcohol, and 3-methyl-3-methoxybutanol; and aromatic hydrocarbons, such as toluene and xylene. Two or more of them may be used.

The content of the solvent is preferably 100 parts by mass or more based on 100 parts by mass of the resin (a) in order to dissolve the composition, and preferably 1,500 parts by mass or less in order to form a coating film having a thickness of 1 µm or more.

The resin composition of the present invention may contain surfactant, esters such as ethyl lactate and propylene glycol monomethyl ether acetate, alcohols such as ethanol, ketones such as cyclohexanone and methyl isobutyl ketone, and ethers such as tetrahydrofuran and dioxane for the purpose of improving wettability on the substrate.

In order to enhance adhesion to the substrate, the resin composition of the present invention may contain a silane coupling agent as a silicone component such as trimethoxyaminopropylsilane, trimethoxyepoxysilane, trimethoxyvinylsilane, and trimethoxythiolpropylsilane as long as the storage stability is not impaired.

The content of the silane coupling agent is preferably 0.01 to 5 parts by mass based on 100 parts by mass of the resin (a).

The resin composition of the present invention may contain other resins. Specific examples thereof include a polyimide precursor, polyimide resin, polybenzoxazole, a polybenzoxazole precursor, polyamide resin, siloxane resin, acrylic polymer copolymerized with acrylic acid, novolac resin, resole resin, polyhydroxystyrene resin, modified products thereof by introducing a crosslinking group such as a methylol group, alkoxymethyl group, epoxy group or the like, and copolymers thereof. Such resins are soluble in an alkaline solution such as tetramethylammonium hydroxide, choline, triethylamine, dimethylaminopyridine, monoethanolamine, diethylaminoethanol, sodium hydroxide, potassium hydroxide, and sodium carbonate. The inclusion of such alkali-soluble resins can impart the properties of each alkali-soluble resin while maintaining adhesion and superior sensitivity of the cured film.

Among them, taking account of possibility to reduce stress because of low change rate in shrinkage before and after curing in addition to the viewpoint of enhancing sensitivity, novolac resin, resole resin, or phenol resin such as modified products of the foregoing prepared by introducing a crosslinking group such as methylol group, alkoxymethyl group, epoxy group, or the like thereto is preferable.

The content of such a resin is preferably 5 to 200 parts by mass, more preferably 15 to 150 parts by mass based on 100 parts by mass of the resin (a) according to the present invention.

The resin composition of the present invention may further contain a dissolution modifier as long as shrinkage rate after curing is not large. As a dissolution modifier, any compound may suitably be used as long as it is a compound which is commonly used as a dissolution modifier for a positive-working resist, such as polyhydroxy compounds, sulfonamide compounds, and urea compounds. Especially, polyhydroxy compounds which are raw materials for synthesizing quinonediazide compounds are preferably used.

The viscosity of the resin composition of the present invention is preferably 2 to 5,000 mPa·s. The viscosity can be measured using an E type rotary viscometer. By adjusting the solid concentration to give a viscosity of 2 mPa·s or more, it becomes easy to obtain a desired film thickness. Further, the viscosity of 5,000 mPa·s or less facilitates obtaining a highly uniform coating film. A resin composition having such a viscosity can be easily obtained by, for example, adjusting the solid concentration to 5 to 60% by mass.

In the following is described a method of forming a relief pattern of a cured film as the cured film including the resin composition of the present invention.

First, the resin composition of the present invention is applied to a substrate. Examples of the substrate include, but are not limited to, silicon wafers, ceramics, gallium arsenic, organic circuit boards, inorganic circuit boards, composite substrates composed of sealing resins, such as epoxy resin, and silicon wafers, and these substrates with circuit-constituting materials disposed thereon. Examples of organic circuit boards include glass-substrate copper-clad laminate sheets such as glass fabric/epoxy copper-clad laminate sheets; composite copper-clad laminate sheets such as glass nonwoven fabric/epoxy copper-clad laminate sheets; temporary adhesive carrier substrate; heat-resistant/thermoplastic substrates such as polyether imide resin substrates, polyether ketone resin substrates, and polysulfone resin substrates; and flexible substrates such as polyester copper-clad film substrates, and polyimide copper-clad film substrates. Examples of inorganic circuit boards include ceramic substrates such as glass substrate, alumina substrates, aluminum nitride substrates, and silicon carbide substrates; and metal substrates such as aluminum-based substrates and iron-based substrates. Examples of circuit-constituting materials include conductors including metals such as silver, gold, and copper; resistance elements including inorganic oxides and the like; low dielectric materials including glass-based materials and/or resins or the like; high dielectric materials including resins, highly dielectric inorganic particles or the like; and insulating materials including glass-based materials or the like.

Preferably, the metal wiring has been subjected in advance to oxygen plasma treatment or oxidation treatment with hydrogen peroxide solution because its surface state is changed from air oxidation.

Examples of the method of coating include such methods as spin-coating using a spinner, spray coating, roll coating, screen printing, blade coater, die coater, calender coater, meniscus coater, bar coater, roll coater, comma roll coater, gravure coater, screen coater, and slit die coater. Moreover, the thickness of a coating film varies depending on the coating technique, the solid concentration and the viscosity of the composition, or the like, and the composition is typically applied such that the film thickness after drying is 0.1 to 150 μm. When the resin composition of the present invention is formed into a photosensitive uncured sheet, the sheet is then dried and peeled.

In order to enhance adhesion between a substrate, such as silicon wafer, and the resin composition, the substrate can be subjected to a pretreatment with the above-described silane coupling agent. For example, a surface treatment is carried out by spin-coating, dipping, spray coating, vapor treatment, or the like with a solution of 0.5 to 20% by mass of silane coupling agent dissolved in a solvent, such as isopropanol, ethanol, methanol, water, tetrahydrofuran, propylene glycol monomethyl ether acetate, propylene glycol monomethyl ether, ethyl lactate, or diethyl adipate. In some cases, a heat treatment up to 50° C. to 300° C. is subsequently carried out to promote the reaction between the substrate and the silane coupling agent.

Subsequently, the substrate on which the resin composition has been applied or on which the photosensitive uncured sheet is laminated is dried to obtain a resin composition coating film. Preferably, the drying is carried out using an oven, a hot plate, infrared light, or the like at a temperature in the range of 50° C. to 150° C. for one minute to several hours.

Subsequently, the resin composition coated film is exposed to light by irradiating actinic rays through a mask having a desired pattern disposed on the composition coating film. Examples of the actinic rays used for the exposure include ultraviolet rays, visible rays, electron beams, and X-rays. For the present invention, i-line (365 nm), h-line (405 nm), or g-line (436 nm) radiation from a mercury lamp is preferably used.

For forming a pattern, after the exposure, the exposed portion is removed in case of positive-working or the unexposed portion is removed in case of negative-working, by using a developing solution. Examples of preferable developing solutions include solutions of alkaline compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. In some cases, polar solvents, such as N-methyl-2-pyrrolidone, N,N-dimethylformamide, N,N-dimethylacetamide, dimethylsulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutylketones, and methyl isobutyl ketone, and the like may be added to these alkaline solution solely or in combination of some species thereof. Development can be carried out by a method of spraying a coating surface with the aforementioned developing solution, a method of immersion in the developing solution, a method of applying ultrasonication while being immersed, or a method of spraying with the developing solution while the substrate is rotated. Preferably, a rinse treatment is carried out using water after the development. The rinse treatment may be carried out with addition to water of alcohols such as ethanol and isopropyl alcohol; esters such as ethyl lactate and propylene glycol monomethyl ether acetate; or the like.

After the development, a thermal crosslinking reaction is advanced by applying a temperature of 150° C. to 500° C. Heat resistance and chemical resistance can be enhanced by crosslinking. As a method of this heat treatment can be chosen a method in which the temperature is selected and the temperature is raised stepwise or a method in which a certain temperature range is selected and the temperature is continuously raised for 5 minutes to 5 hours. One example of the former is a method in which the heat treatment is carried out at 130° C. and 200° C. for 30 minutes each. One example of the latter is a method in which the heat treatment is carried out by raising temperature from room temperature to 400° C. in a linear manner over two hours. The curing condition in the present invention is preferably 150° C. or more and 350° C. or less, and more preferably 160° C. or more and 250° C. or less because the present invention provides a cured film superior in curability especially at low temperatures.

The heat treatment, namely the curing condition, in the present invention is preferably 170° C. or more and 400° C. or less. In order to obtain the effect of low stress, a condition of 170° C. or more and 250° C. or less is more preferable.

The cured film obtained by curing the resin composition of the present invention has an elongation at break of preferably 30% or more, and more preferably 50% or more. The interlayer insulating film, which is to be in contact with various materials, is required to be made of a material with extension as high as possible because a load due to difference in thermal expansion coefficient is prone to be put thereon. Since the cured film obtained by curing the resin composition of the present invention has high extensibility, cracks in the cured film and peeling off of the cured film from metal wirings are unlikely to occur even in reliability evaluation. Examples of the reliability evaluation include an impact test, a high temperature holding test, a constant temperature high humidity test, and a thermal cycle test. Cured films produced by curing the resin composition of the present invention can be used in electronic components such as semiconductor devices and multilayer wiring boards. Specifically, such cured films are suitably used for applications including, but not limited to, passivation films for semiconductors, surface protection films and interlayer insulating films for semiconductor elements, interlayer insulating films of multilayer wiring for high-density mounting, insulating layers for organic electroluminescent elements, and the like, and can be used in various structures.

Next, an application example in which the resin composition of the present invention is used to a semiconductor device having a bump will be described with reference to the drawings (Application Example 1). FIG. 1 is an enlarged cross-sectional view of a pad portion of a semiconductor device of the present invention having a bump. As illustrated in FIG. 1, a passivation film 3 is formed on an aluminum (hereinafter referred to as Al) pad 2 for input/output on a silicon wafer 1, and a via-hole is formed on the passivation film 3. Further on this film, an insulating film 4 is formed as a pattern made of the resin composition of the present invention, and further thereon, a metal (Cr, Ti, or the like) film 5 is formed to be connected with the Al pad 2, and then a metal wiring (Al, Cu, or the like) 6 is formed by electroplating or the like. By etching the metal film 5 around a solder bump 10, insulation is established between the pads. On the insulated pad, a barrier metal 8 and the solder bump 10 are formed. The resin composition of the insulating film 7 can be subjected to thick film processing in a scribe line 9. When a softening component has been introduced into the resin composition, wafer warpage is so small that light exposure and wafer transport can be carried out with high precision. Moreover, since the resin of the present invention is also superior in high extensibility, the stress from the sealing resin can be relieved in mounting by deformation of the resin itself, and therefore, any damage to the bump, wiring and the low-k layer can be prevented and a semiconductor device with high reliability can be provided.

Figure 2:
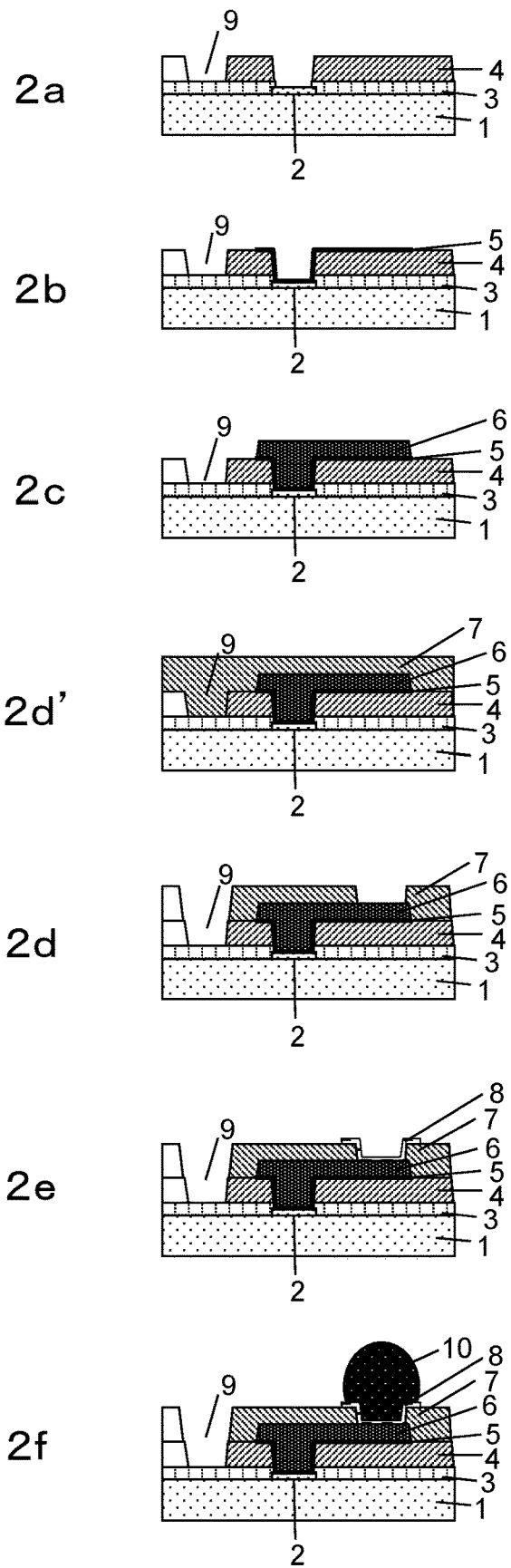
FIG. 2 depicts a detailed method for producing the semiconductor device having a bump.

Next, a method of manufacturing a semiconductor device is described in detail in FIG. 2. As illustrated in 2a in FIG. 2, an Al pad 2 for input/output and also a passivation film 3 are formed on a silicon wafer 1, and an insulating film 4 is then formed as a pattern that is made of the photosensitive resin composition of the present invention. Subsequently, as illustrated in 2b in FIG. 2, a metal (Cr, Ti, or the like) film 5 is formed to be connected with the Al pad 2, and a metal wiring 6 is formed as a film by a plating method as illustrated in 2c in FIG. 2. Next, as illustrated in 2d in FIG. 2, the resin composition of the present invention is applied, and an insulating film 7 is formed as a pattern as illustrated in 2d in FIG. 2 via a photolithographic process. Further wiring (so-called rewiring) can be formed on the insulating film 7. In the case of forming a multilayer wiring structure including two or more layers, the multilayer wiring structure in which the rewirings of two or more layers are separated by interlayer insulating film obtained from the resin composition of the present invention can be formed by repeating the aforementioned processes. In this case, the insulating film formed will come into contact with various liquid chemicals several times, but the insulating film obtained from the resin composition of the present invention is so good in adhesion property that it can form a good multilayer wiring structure. The number of layers of the multilayer wiring structure has no upper limit, but structures having 10 or less layers are often used. During this step, the resin composition for the insulating film 7 is subjected to thick film processing in a scribe line 9. In the case of forming a multilayer wiring structure comprising three or more layers, the respective layers can be formed by repeating the above-described step.

Subsequently, as illustrated in 2e and 2f in FIG. 2, a barrier metal 8 and a solder bump 10 are formed. Then, the structure is diced along the last scribe line 9 to separate individual chips.

Figure 3:
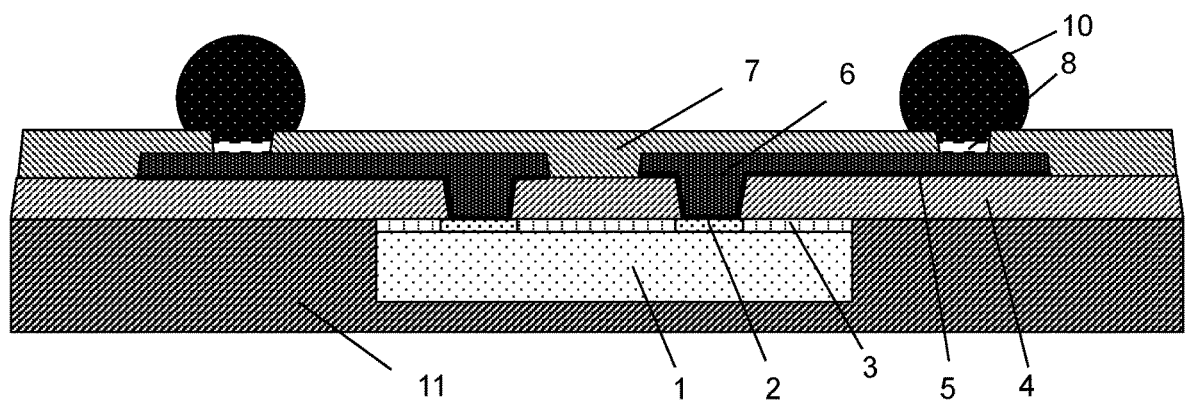
FIG. 3 depicts an enlarged cross-sectional view of a half pad portion showing an example of the present invention.

Next, Application Example 2 in which the resin composition of the present invention is used to a semiconductor device having a bump will be described with reference to the drawings. FIG. 3 is an enlarged cross-sectional view of a pad portion of a semiconductor device having the insulating film of the present invention, and is a structure called fan-out wafer level package (fan-out WLP). In the same manner as the above-mentioned application example 1, a silicon wafer 1 on which an Al pad 2 and a passivation film 3 have been formed is diced into chips and then sealed with a resin 11. Over the sealing resin 11 and the chips, an insulating film 4 is formed as a pattern made of the resin composition of the present invention and a metal (Cr, Ti, or the like) film 5 and a metal wiring 6 are further formed. Subsequently, a barrier metal 8 and a solder bump 10 are formed in an opening part of an insulating film 7 formed on an off-chip sealing resin. A fan-out WLP is a semiconductor package in which a necessary number of terminals are ensured by providing a part extended using a sealing resin such as an epoxy resin in the periphery of the semiconductor chip, providing rewiring from the electrode on the semiconductor chip to the extended part, and mounting a solder ball also on the extended part. In a fan-out WLP, wiring is installed to be across the borderline formed by the principal surface of the semiconductor chip and the principal surface of the sealing resin. In other words, an interlayer insulating film is formed on a substrate made of two or more materials, which are a semiconductor chip and a sealing resin with metal wiring disposed on both of them, and wiring is formed on the interlayer insulating film.

There is such a type of package that a fan-out WLP is made by a process in which an insulating film is disposed as an interlayer insulating film between rewirings on a support substrate on which a temporary sticking material is disposed, and a silicon chip and a sealing resin are disposed thereon, followed by a step, called RDL-first, of peeling between the support substrate on which a temporary adhesive material is disposed and the rewiring. In this process, warping due to film shrinkage of the interlayer insulating film and in-plane uniformity of film thickness and pattern are problems because a large area panel is used for the merit in cost aspect due to mass production.

Figure 5:
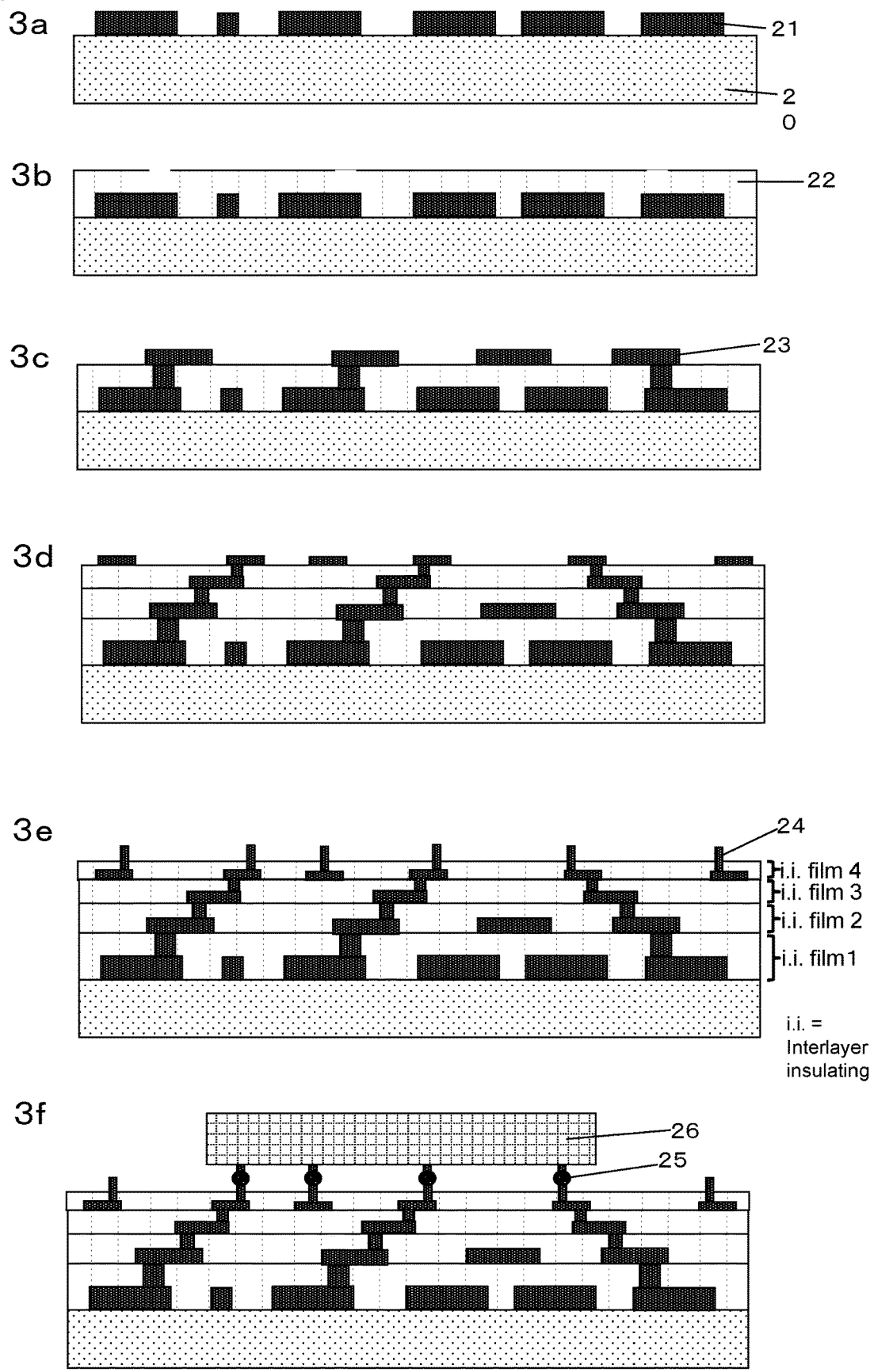
FIG. 5 depicts a method for producing a semiconductor device in RDL first.

A method of fabricating a semiconductor device in RDL first is described with reference to FIG. 5. In 3a in FIG. 5, a barrier metal such as Ti is formed on a support substrate 20 by a sputtering method and a Cu seed (seed layer) is further formed on the support substrate 20 by a sputtering method, and an electrode pad 21 is formed by a plating method. Subsequently, the photosensitive resin composition of the present invention is applied in step 3*b*, and a patterned insulating film 22 is formed through a photolithography step. Subsequently, in step 3*c*, a seed layer is again formed by a sputtering method, and a metal wiring 23 (rewiring layer) is formed by a plating method. In order to match the pitch of conducting portions of a semiconductor chip with the pitch of metal wirings from then on, the steps 3*b* and 3*c* are repeated to form a multilayer wiring structure as shown in 3*d*. Subsequently, the photosensitive resin composition of the present invention is again applied in step 3*e*, a patterned insulating film is formed through a photolithography step, and then a Cu post 24 is formed by a plating method. Here, the pitch of Cu posts and the pitch of conducting portions of the semiconductor chip are equal. That is, in order to form multiple rewiring layers while reducing the metal wiring pitch, the thickness of the interlayer insulating films is configured to be interlayer insulating film 1>interlayer insulating film 2>interlayer insulating film 3>interlayer insulating film 4>as shown in 3*e* of FIG. 3. Subsequently, in step 3*f*, a semiconductor chip 26 is connected via a solder bump 25, so that a semiconductor device with RDL first having a multilayer wiring structure can be obtained. Besides this, in a semiconductor package characterized in that a semiconductor chip is embedded in a recess formed in a glass epoxy resin substrate, wirings are provided so as to straddle the boundary line between the main surface of the semiconductor chip and the main surface of the printed circuit board. Also in this embodiment, an interlayer insulating film is formed on a substrate composed of two or more materials, and wirings are formed on the interlayer insulating film. Since the cured film obtained by curing the resin composition of the present invention has a high extension and a high adhesion to a semiconductor chip provided with a metal wiring and also has a high adhesion to a sealing resin to an epoxy resin or the like, the cured film is suitably used as an interlayer insulating film provided on a substrate composed of two or more materials.

In a fan-out WLP, the miniaturization of rewiring is proceeding. A cured film from the resin composition of the present invention is suitably used for a fine rewiring because of high adhesion to metals even for wirings in which the line width of the metal wirings and the interval between adjacent wirings are 5 μm or less.

In this structure, fabrication of higher integration of chips is addressed by the configuration in which the thickness of the interlayer insulating films decreases as approaching the semiconductor chip, and the line width of the metal wirings and the interval between the adjacent wirings decrease as the rewiring layers approach the semiconductor chip. For this reason, along with the increase in resolution, in-plane uniformity on rewiring with steps is an important issue.

Figure 4:
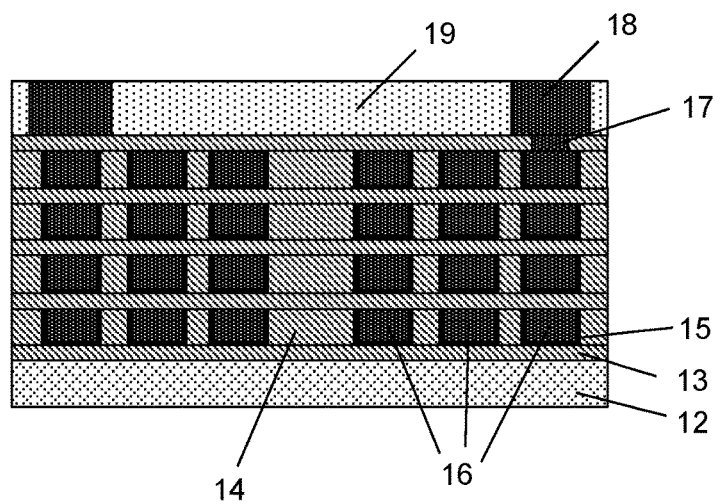
FIG. 4 depicts a cross-sectional view of a coil part of an inductor device showing an example of the present invention.

Next, Application Example 3 in which the resin composition according to the present invention is used to a coil part of an inductor device will be described with reference to the drawings. FIG. 4 is a cross-sectional view of a coil part having the insulating film according to the present invention. As illustrated in FIG. 4, the insulating film 13 is formed on the substrate 12, and the insulating film 14 is formed thereon as a pattern. Ferrite or the like is used as the substrate 12. The resin composition of the present invention may be used for either the insulating film 13 or the insulating film 14. The metal (Cr, Ti, etc.) film 15 is formed in an opening of this pattern, and the metal wiring (Ag, Cu, etc.) 16 is formed thereon by plating. The metal wiring 16 (Ag, Cu, etc.) is formed on a spiral. By repeating the steps of 13 to 16 multiple times to stack layers, a function as a coil can be provided. Finally, the metal wiring 16 (Ag, Cu, etc.) is connected to the electrode 18 via the metal wiring 17 (Ag, Cu, etc.) and sealed with the sealing resin 19.

The resin composition of the present invention is also suitably used for organic EL display devices. The organic EL display device has a driving circuit, a flattening layer, a first electrode, an insulating layer, a light emitting layer, and a second electrode on a substrate, and the flattening layer and/or the insulating layer is formed of the cured film of the present invention. In recent years, organic EL display devices have been required to be maintained at high temperatures of about 100° C. or to have durability in reliability evaluation such as a thermal cycle test. Since cured films of the present invention have high extension and high adhesion to metal wirings and metal electrodes even after their reliability evaluation, stable drive and light emission characteristics can be obtained. Taking an active matrix type display device as an example, a TFT and a wiring positioned on a side portion of the TFT and connected to the TFT are formed on a substrate of glass or various plastics, and irregularities are covered with a flattening layer, and a display element is provided on the flattening layer. The display element and the wiring are connected via a contact hole formed in the flattening layer.

Figure 6:
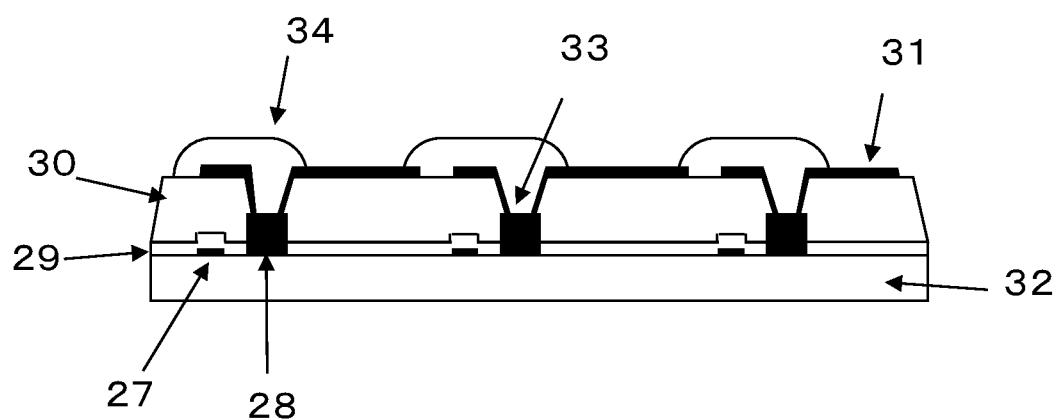
FIG. 6 depicts a cross-sectional view of an example of a TFT substrate.

FIG. 6 illustrates a cross-sectional view of an example of a TFT substrate. A bottom gate type or top gate type TFT (thin film transistor) 1 is provided in a matrix on a substrate 32, and an insulating layer 29 is formed so as to cover the TFT 27. On the insulating layer 29 is provided a wiring 28 connected to the TFT 27. Furthermore, on the insulating layer 29, a flattening layer 30 is disposed with the wiring 28 being embedding therein. The flattening layer 30 is provided with a contact hole 33 reaching the wiring 28. An ITO (transparent electrode) 31 is formed on the flattening layer 30 with the ITO being connected to the wiring 28 via the contact hole 33. Here, the ITO 31 is an electrode of a display element (for example, an organic EL element). Then, an insulating layer 34 is formed to cover the peripheral edge of the ITO 31. The organic EL element may be of either a top emission type in which light is emitted from the side opposite to the substrate 32 or a bottom emission type in which light is extracted from the side closer to the substrate 32. In this manner, an active matrix type organic EL display device in which organic EL elements are connected with a TFT 27 for driving the organic EL elements is obtained.

The insulating layer 29, the flattening layer 30 and/or the insulating layer 34 can be formed by a step of forming a photosensitive resin film composed of the resin composition or the resin sheet of the present invention as described above, a step of exposing the photosensitive resin film to light, a step of developing the exposed photosensitive resin film, and a step of heat-treating the developed photosensitive resin film. By a production method having these steps, organic EL display devices can be obtained.

EXAMPLES

The present invention will be hereafter described with reference to examples, but the present invention is not limited by these examples. First, the evaluation methods used in examples and comparative examples are described. The resin compositions (hereinafter referred to as varnishes) prepared in the respective Examples and Comparative Examples and having been filtered through a 1 μm filter made of polytetrafluoroethylene (manufactured by Sumitomo Electric Industries, Ltd.) in advance were used for evaluations.

(1) Measurement of Molecular Weight, Measurement of Imidization Degree

The weight average molecular weight (Mw) of the resin (a) was examined using a GPC (gel permeation chromatography) apparatus Waters 2690-996 (manufactured by Nihon Waters K.K.). Measurement was carried out using N-methyl-2-pyrrolidone (hereinafter referred to as NMP) as a developing solvent, and then a weight average molecular weight (Mw) and a polydispersity index (PDI=Mw/Mn) in terms of polystyrene were calculated.

For the imidization degree of a resin, a solution of the resin in γ-butyrolactone was spin-coated on a silicon wafer, dried at 120° C. for 3 minutes to obtain a coating film with a thickness of 5 μm, and the coating film was measured by infrared absorption spectroscopy to confirm the presence of absorption peaks (around 1780 $cm^{-1}$ and around 1377 $cm^{-1}$) assigned to an imide structure. Next, the coating film was heat-treated at 350° C. for one hour, and then using the resulting film as a sample with an imidization degree of 100%, an infrared absorption spectrum was measured. By comparing the peak intensity near 1377 $cm^{-1}$ of the resin before and after the heat treatment, the content of imide groups in the resin before the heat treatment was calculated, and then an imidization degree was determined. In the measurement of the infrared absorption spectra, "FT-720" (trade name, manufactured by Horiba, Ltd.) was used as a measuring device.

(2)-1 Evaluation of Resolution

A varnish was applied onto an 8-inch silicon wafer by a spin-coating method using a coater/developer ACT-8 (manufactured by Tokyo Electron Limited) in such a manner that the film thickness was 10.5 μm to 12 μm, and then was prebaked at 120° C. for 3 minutes. A reticle with a circular via pattern cut was set in an exposure device i-line stepper DSW-8000 (manufactured by GCA) and the coating was exposed at an exposure dose of 1500 mJ/$cm^2$. After the exposure, using the developing device ACT-8, development with an aqueous 2.38% by mass tetramethylammonium solution (hereinafter TMAH, produced by Tama Chemicals Co., Ltd.) was repeated twice by a paddle method at an ejection time of a developing solution of 10 seconds and a paddle time of 40 seconds, followed by rinsing with pure water, draining and drying to obtain a pattern with a film thickness of 10 μm. Then, the pattern was observed with a flat panel display microscope MX61 (manufactured by Olympus Corporation) at a magnification of 20 times, and the minimum dimension at which a via pattern was resolved was regarded as resolution.

For a non-photosensitive resin composition composed of (c) a naphthoquinonediazide compound, a polymerization initiator, and a photopolymerizable compound in which no photosensitizer is added, a varnish was applied onto an 8-inch silicon wafer by a spin-coating method using a coater/developer ACT-8 (manufactured by Tokyo Electron Limited) in such a manner that the film thickness was 10.5 μm to 12 μm, then a positive-working resist OFPR-800 (produced by TOKYO OHKA KOGYO CO., LTD.) was applied at 120° C., and then these were prebaked for 3 minutes. A reticle with a circular via pattern cut was set in an exposure device i-line stepper DSW-8000 (manufactured by GCA) and the coating was exposed at an exposure dose of 1500 mJ/$cm^2$. After the exposure, using the developing device ACT-8, development with an aqueous 2.38% by mass tetramethylammonium solution (hereinafter TMAH, produced by Tama Chemicals Co., Ltd.) was repeated twice by a paddle method at an ejection time of a developing solution of 10 seconds and a paddle time of 40 seconds, followed by rinsing with pure water, draining and drying, and peeling off the unexposed resist with acetone to obtain a positive-working pattern with a film thickness of 10 μm. Then, the pattern was observed with a flat panel display microscope MX61 (manufactured by Olympus Corporation) at a magnification of 20 times, and the minimum dimension at which a via pattern was resolved was regarded as resolution.

(2)-2 Evaluation of in-Plane Uniformity (Film Thickness)

The varnish was applied onto an 8-inch silicon wafer by a spin-coating method using a coater/developer ACT-8 and prebaked at 120° C. for 3 minutes in such a manner that the film thickness was 11 μm after prebaking, followed by a heat-treatment using an Inert Oven CLH-21CD-S (manufactured by Koyo Thermo Systems Co., Ltd.) in such a manner that the temperature was raised to 190° C. at a rate of 3.5° C./min and then held at 190° C. for one hour at an oxygen concentration of 20 ppm or less. When the temperature reached 50° C. or less, the wafer was taken out and slowly cooled, and then, the 8-inch wafer was measured for the thickness of film at nine points at 2 cm intervals on the left and right sides with respect to the center by using a flat panel display microscope MX 61 (manufactured by Olympus Corporation), and the difference between the minimum value and the maximum value of film thickness was taken as the in-plane uniformity of film thickness. The sample was evaluated as Excellent (A) when the value of the in-plane uniformity of film thickness was less than 0.15 m; Good (B) when it was 0.15 to less than 0.4 μm; Fair (C) when it was 0.4 to less than 0.8 m; and Poor (D) when it was 0.8 μm or more.

(2)-3 Evaluation of in-Plane Uniformity (Pattern)

Nine shots of patterns similar to those of (2)-2 were prepared at 2 cm intervals on the left and right sides with respect to the center of an 8-inch wafer, and using an Inert Oven CLH-21CD-S (manufactured by Koyo Thermo Systems Co., Ltd.) in such a manner that the temperature was raised to 190° C. at a rate of 3.5° C./min and then held at 190° C. for one hour at an oxygen concentration of 20 ppm or less. When the temperature reached 50° C. or less, the wafer was taken out and slowly cooled, and then, in each of the nine shots, the pattern dimension of resolution was measured with a scanning laser microscope 1LM21 (manufactured by Lasertec Corporation), and the difference between the minimum value and the maximum value of the dimension was taken as the in-plane uniformity of pattern.

The sample was evaluated as Excellent (A) when the value of the in-plane uniformity of pattern was less than 0.8 m; Good (B) when it was 0.8 to less than 1.2 m; Fair (C) when it was 1.2 to less than 1.5 m; and Poor (D) when it was 1.5 μm or more.

(3)-1 Evaluation of Extensibility

The varnish was applied onto an 8-inch silicon wafer by a spin-coating method using a coater/developer ACT-8 and prebaked at 120° C. for 3 minutes in such a manner that the film thickness was 11 μm after prebaking, followed by a heat-treatment using an Inert Oven CLH-21CD-S (manufactured by Koyo Thermo Systems Co., Ltd.) in such a manner that the temperature was raised to 190° C. at a rate of 3.5° C./min and then held at 190° C. for one hour at an oxygen concentration of 20 ppm or less. When the temperature reached 50° C. or less, the wafer was taken out and slowly cooled, and then immersed in 45% by mass of hydrofluoric acid for 5 minutes to thereby separate the resin composition film from the wafer. The resulting film was cut into 1 cm wide, 9 cm long strips, which were pulled using a TENSILON RTM-100 (manufactured by Orientec Corporation) at a tension rate of 50 mm/minute at a room temperature of 23.0° C. and a humidity of 45.0% RH to measure an elongation at break. Ten strips per specimen were measured to determine the average value of the top five measurements. The film was evaluated as Excellent (A) when the elongation at break was 80% or more; Good (B) when it was 50% or more and less than 80%; Fair (C) when it was 25% or more and less than 50%; and Poor (D) when it was less than 25%.

(3)-2 Evaluation of Extensibility after Thermal Cycle Test (TC)

The varnish was applied onto an 8-inch silicon wafer by a spin-coating method using a coater/developer ACT-8 and prebaked at 120° C. for 3 minutes in such a manner that the film thickness was 11 μm after prebaking, followed by a heat-treatment using an Inert Oven CLH-21CD-S (manufactured by Koyo Thermo Systems Co., Ltd.) in such a manner that the temperature was raised to 190° C. at a rate of 3.5° C./min and then held at 190° C. for one hour at an oxygen concentration of 20 ppm or less. When the temperature became 50° C. or less, the wafer was taken out and slowly cooled, and then, using a thermal cycle tester (hereinafter referred to as "TC apparatus") (manufactured by Tabai Espec Corp.), 500 cycles of treatment, at −45° C. for 15 minutes and at 125° C. for 15 minutes per cycle, were carried out. The wafer was taken out and immersed in 45% by mass of hydrofluoric acid for 5 minutes, whereby the film of the resin composition was peeled off from the wafer. The resulting film was cut into 1 cm wide, 9 cm long strips, which were pulled using a TENSILON RTM-100 (manufactured by Orientec Corporation) at a tension rate of 50 mm/minute at a room temperature of 23.0° C. and a humidity of 45.0% RH to measure an elongation at break. Ten strips per specimen were measured to determine the average value of the top five measurements. The film was evaluated as Excellent (A) when the elongation at break was 50% or more; Good (B) when it was 30% or more and less than 50%; Fair (C) when it was 15% or more and less than 30%; and Poor (D) when it was less than 15%.

(4) Evaluation of Adhesion to Metal

Titanium and copper were sputtered each to a thickness of 100 nm onto a silicon wafer and then a deposited copper film was formed by electrolytic plating to yield a substrate having on its surface a metallic material layer formed with a thickness of 2 μm. A varnish was applied onto the substrate by a spin-coating method using a spinner (manufactured by Mikasa Co., Ltd.) and then baked on a hot plate (D-SPIN, manufactured by Dai Nippon Screen Manufacturing Co., Ltd) at 120° C. for 3 minutes to eventually produce a prebaked film having a thickness of 10 μm. These films were cured under a nitrogen gas stream (oxygen concentration: 20 ppm or less) using a clean oven (CLH-21CD-S, manufactured by Koyo Thermo Systems Co., Ltd.) at 140° C. for 30 minutes and then at a raised temperature of 190° C. for additional one hour to afford cured resin films. Each of the cured films was cut shallow on its surface using a single edged knife in a grid shape of 10 rows and 10 lines, spaced 2 mm apart. The number of peeled squares out of 100 squares which were tested to be peeled off using CELLO-TAPE (registered trademark) was counted, and thus the adhesion property between the metal material and the cured resin film was evaluated. Next, using a TC apparatus, the above-described peeling test was carried out after performing 500 cycles of treatment, at −45° C. for 15 minutes and at 125° C. for 15 minutes per cycle. For each of the substrates, the result was evaluated as Excellent (A) when the number of peeled squares in the peeling test was 0, Good (B) when it was 1 to less than 20, and Poor (D) when it was 20 or more.

(5) Evaluation of Copper Pattern Cross Section after TC

A copper pattern wafer having copper via patterns with a diameter of 60 μm formed at intervals of 150 μm in a thickness of 5 μm on a silicon wafer was prepared, and then it was subjected to plasma etching at an oxygen flow rate of 50 sccm, a pressure of 20 Pa, an output of 1200 W, and a time of 60 seconds by using a plasma processing apparatus (SPC-100 B+H, manufactured by Hitachi High-Tech Instruments Co., Ltd.).

A varnish was applied onto the substrate by a spin-coating method using a spinner (manufactured by Mikasa Co., Ltd.) and then baked on a hot plate (D-SPIN, manufactured by Dai Nippon Screen Manufacturing Co., Ltd) at 120° C. for 3 minutes to eventually produce three sheets of prebaked film having a thickness of 10 μm. These films were cured under a nitrogen gas stream (oxygen concentration: 20 ppm or less) using a clean oven (CLH-21CD-S, manufactured by Koyo Thermo Systems Co., Ltd.) at 140° C. for 30 minutes and then at a raised temperature of 190° C. for additional one hour to afford three sheets of copper-patterned substrates with a cured resin film.

The copper pattern substrates on which the cured resin film was formed were subjected to 500 cycles of treatment at −45° C. for 15 minutes and at 125° C. 15 minutes per cycle (hereinafter expressed by −45° C.⇔125° C.), 500 cycles of treatment at −45° C. for 15 minutes and at 150° C. for 15 minutes per cycle (hereinafter −45° C.⇔150° C.), and 500 cycles of treatment at −60° C. for 15 minutes and at 150° C. for 15 minutes per cycle (hereinafter −60° C.⇔150° C.) each using a TC apparatus. The substrates treated under the three conditions, respectively, were cross-sectioned with an Ion Milling System (IM 4000, manufactured by Hitachi High-Technologies Corporation), followed by cross-section observation with a scanning electron microscope (SEM, S-3000N manufactured by Hitachi High-Technologies Corporation). Samples in which a cured film had no cracks, or peeling off of a cured film from a copper via pattern was not observed, or cohesive peeling of a copper via pattern (peeling between a copper layer and a copper oxide layer) was not observed were evaluated as pass, and a sample was evaluated as Excellent (A) when it passed in the treatment 60° C.⇔150° C., Good (B) when it passed in the treatment −45°

C.⇔150° C., Fair (C) when it passed in the treatment −45° C.⇔125° C., and Fail (D) when it did not pass under any conditions.

(Synthesis Example 1) Synthesis of Acid A

In a 250-ml three-necked flask, 27.2 g (0.4 mol) of imidazole and then 100 g of methylene chloride were placed under nitrogen flow, and then stirred at room temperature. The resulting mixture was cooled to −5° C. or lower, and a suspension of 29.5 g (0.1 mol) of 4,4'-diphenyl ether dicarboxylic acid dichloride in 100 g of methylene chloride was added dropwise over one hour ensuring the temperature of the reaction solution did not exceed 0° C. After the addition, the reaction solution was stirred at room temperature for additional 3 hours, and the precipitate generated during the reaction was collected by filtration. The collected precipitate was washed with pure water several times, dried at 50° C. in a vacuum oven for 100 hours to obtain acid A represented by the following formula.

[Chemical Formula 31]

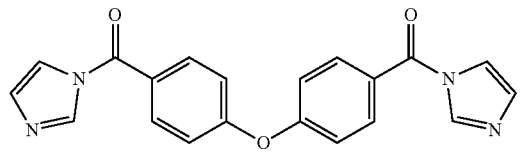

(Synthesis Example 2) Synthesis of Polyimide Resin (A-1)

Under dry nitrogen flow, 2,2-bis(3-amino-4-hydroxyphenyl)hexafluoropropane (hereinafter referred to as BAHF) (18.3 g, 0.05 mol), 1,3-bis(3-aminopropyl)tetramethyldisiloxane (0.62 g, 0.0025 mol) and 5-norbornene-2,3-dicarboxylic acid (0.82 g, 0.005 mol) were dissolved in 125 g of NMP. To this, 4,4'-oxydiphthalic anhydride (13.95 g, 0.045 mol) was added along with 25 g of NMP, and the resulting mixture was stirred at 60° C. for one hour and then at 180° C. for 4 hours. After the stirring was finished, the solution was poured into 3 L of water to afford a white precipitate. This precipitate was collected by filtration, washed with water three times, and then dried in a forced-air dryer at 50° C. for three days to obtain a powder of polyimide resin (A-1). The imidization degree of the resin thus obtained was 97%. The weight average molecular weight was 38,800 and the PDI was 1.9.

(Synthesis Example 3) Synthesis of Polyamide Resin (A-2)

Under dry nitrogen flow, 2,2-bis(3-amino-4-hydroxyphenyl)hexafluoropropane (hereinafter referred to as BAHF) (15.6 g, 0.043 mol), RT-1000 (7.5 g, 0.0075 mol), and 1,3-bis(3-aminopropyl)tetramethyldisiloxane (0.62 g, 0.0025 mol) were dissolved in 100 g of NMP. To this, acid A (13.51 g, 0.045 mol) and 5-norbornene-2,3-dicarboxylic acid (0.82 g, 0.005 mol) were added along with 25 g of NMP and the resulting mixture was reacted at 85° C. for 3 hours. After the completion of the reaction, the reaction mixture was cooled to room temperature, and acetic acid (13.20 g, 0.25 mol) was added along with 25 g of NMP, and the resulting mixture was stirred at room temperature for one hour. After the stirring was finished, the solution was poured into 1.5 L of water to obtain a white precipitate. This precipitate was collected by filtration, washed with water three times, and then dried in a forced-air dryer at 50° C. for three days to obtain a powder of polyamide resin (A-2). The weight average molecular weight was 32,600 and the PDI was 1.9.

(Synthesis Example 4) Polyamide-Polyimide Copolymer Resin (A-3)

Under dry nitrogen gas flow, BAHF (14.6 g, 0.040 mol) and RT-1000 (7.5 g, 0.0075 mol) were dissolved in 100 g of NMP. To this, acid A (11.26 g, 0.038 mol) was added along with 10 g of NMP, and the resulting mixture was reacted at 85° C. for 3 hours. Subsequently, BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were added along with 5 g of NMP, and the resulting mixture was reacted at 85° C. for one hour, and then 4,4'-oxydiphthalic anhydride (2.33 g, 0.0075 mol) was added along with 5 g of NMP, and the resulting mixture was reacted at 85° C. for one hour. After the completion of the reaction, the reaction mixture was cooled to room temperature, and acetic acid (13.20 g, 0.25 mol) was added along with 25 g of NMP, and the resulting mixture was stirred at room temperature for one hour. After the stirring was finished, the solution was poured into 1.5 L of water to obtain a white precipitate. This precipitate was collected by filtration, washed with water three times, and then dried in a forced-air dryer at 50° C. for three days to obtain a powder of polyamide-polyimide copolymerized resin (A-3). The imidization degree of the resin thus obtained was 70%. The weight average molecular weight was 32,600 and the PDI was 1.9. Based on the values of the feed ratios of the polyamide-derived acid A and the 4,4'-oxydiphthalic anhydride derived from the polyimide-polyimide precursor and the imidization degree, the content of the polyimide structural units based on 100% by mole in total of the structural units of polyamide and polyimide was 12%.

(Synthesis Example 5) Synthesis of Phenol Resin (A-4)

Into a mixed solution of 500 ml of tetrahydrofuran and 0.01 mol of sec-butyllithium as an initiator, 20 g in total of p-t-butoxystyrene and styrene are added in a molar ratio of 3:1, and polymerized with stirring for 3 hours. The polymerization was terminated by adding 0.1 mol of methanol to the reaction solution. Next, in order to purify the resulting polymer, the reaction mixture was poured into methanol, and the precipitated polymer was then dried to obtain a white polymer. Furthermore, the resulting mixture was dissolved in 400 ml of acetone, a small amount of concentrated hydrochloric acid was added at 60° C. and stirred for 7 hours, and then poured into water to precipitate the polymer, and the polymer is converted to hydroxystyrene by deprotecting p-t-butoxystyrene, washed and dried to obtain phenol resin (A-4) as a polyhydroxystyrene resin which is a purified copolymer of p-hydroxystyrene and styrene.

(Synthesis Example 6) Synthesis of Polyimide Precursor (A-5)

4,4'-Oxydiphthalic anhydride (155.1 g, 0.5 mol) was fed into a 2 L separable flask, and 125 g of 2-hydroxyethyl methacrylate and 400 ml of γ-butyrolactone were placed therein, stirred at room temperature, and 81.5 g of pyridine was added with stirring to obtain a reaction mixture. After the completion of heat generation due to the reaction, the reaction mixture was allowed to cool to room temperature and then allowed to stand for 16 hours.

Next, under ice-cooling, a solution of 206.3 g of dicyclohexylcarbodiimide in 180 ml of γ-butyrolactone was added to the reaction mixture over 40 minutes with stirring, and subsequently, a suspension of 4,4'-diaminodiphenyl ether (95.0 g, 0.48 mol) in 350 ml of γ-butyrolactone was added over 60 minutes with stirring. After further stirring at room temperature for 2 hours, 30 ml of ethyl alcohol was added and the resulting mixture was stirred for 1 hour, and then 400 ml of γ-butyrolactone was added. The precipitate formed in the reaction mixture was removed by filtration to obtain a reaction solution. The resulting reaction solution was added to 3 L of ethyl alcohol to form a precipitate composed of a crude polymer. The resulting crude polymer was collected by filtration and dissolved in 1.5 L of tetrahydrofuran to obtain a crude polymer solution. The resulting crude polymer solution was added dropwise to 28 L of water to precipitate out the polymer, and the resulting precipitate was collected by filtration and then vacuum-dried to obtain a powder of powdery polyimide precursor (A-5). The imidization degree of the resin thus obtained was 14%. The weight average molecular weight was 38,600, and the PDI was 2.1.

(Synthesis Example 7) Synthesis of Polyamide-Polyimide Copolymerized Resin (A-6)

Under dry nitrogen gas flow, BAHF (14.6 g, 0.040 mol) and RT-1000 (7.5 g, 0.0075 mol) were dissolved in 100 g of NMP. To this, acid A (13.06 g, 0.044 mol) was added along with 10 g of NMP, and the resulting mixture was reacted at 85° C. for 3 hours. Subsequently, BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were added along with 5 g of NMP, and the resulting mixture was reacted at 85° C. for one hour, and then 4,4'-oxydiphthalic anhydride (0.47 g, 0.0015 mol) was added along with 5 g of NMP, and the resulting mixture was reacted at 85° C. for one hour. After the completion of the reaction, the reaction mixture was cooled to room temperature, and acetic acid (13.20 g, 0.25 mol) was added along with 25 g of NMP, and the resulting mixture was stirred at room temperature for one hour. After the stirring was finished, the solution was poured into 1.5 L of water to obtain a white precipitate. This precipitate was collected by filtration, washed with water three times, and then dried in a forced-air dryer at 50° C. for three days to obtain a powder of polyamide-polyimide copolymerized resin (A-6). The imidization degree of the resin thus obtained was 71%. The weight average molecular weight was 32,300 and the PDI was 1.9. Based on the values of the feed ratios of the polyamide-derived acid A and the 4,4'-oxydiphthalic anhydride derived from the polyimide-polyimide precursor and the imidization degree, the content of the polyimide structural units based on 100% by mole in total of the structural units of polyamide and polyimide was 2%.

(Synthesis Example 8) Polyamide-Polyimide Copolymerized Resin (A-7)

Under dry nitrogen gas flow, BAHF (14.6 g, 0.040 mol) and RT-1000 (7.5 g, 0.0075 mol) were dissolved in 100 g of NMP. To this, acid A (6.76 g, 0.023 mol) was added along with 10 g of NMP, and the resulting mixture was reacted at 85° C. for 3 hours. Subsequently, BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were added along with 5 g of NMP, and the resulting mixture was reacted at 85° C. for one hour, and then 4,4'-oxydiphthalic anhydride (6.93 g, 0.023 mol) was added along with 5 g of NMP, and the resulting mixture was reacted at 85° C. for one hour. After the completion of the reaction, the reaction mixture was cooled to room temperature, and acetic acid (13.20 g, 0.25 mol) was added along with 25 g of NMP, and the resulting mixture was stirred at room temperature for one hour. After the stirring was finished, the solution was poured into 1.5 L of water to obtain a white precipitate. This precipitate was collected by filtration, washed with water three times, and then dried in a forced-air dryer at 50° C. for three days to obtain a powder of polyamide-polyimide copolymerized resin (A-7). The imidization degree of the resin thus obtained was 82%. The weight average molecular weight was 35,300 and the PDI was 1.9. Based on the values of the feed ratios of the polyamide-derived acid A and the 4,4'-oxydiphthalic anhydride derived from the polyimide-polyimide precursor and the imidization degree, the content of the polyimide structural units based on 100% by mole in total of the structural units of polyamide and polyimide was 45%.

(Synthesis Example 9) Synthesis of Polyamide-Polyimide Copolymer Resin (A-8)

Under dry nitrogen gas flow, BAHF (14.6 g, 0.040 mol) and RT-1000 (7.5 g, 0.0075 mol) were dissolved in 100 g of NMP. To this, acid A (9.30 g, 0.03 mol) was added along with 10 g of NMP, and the resulting mixture was reacted at 85° C. for 3 hours. Subsequently, BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were added along with 5 g of NMP, and the resulting mixture was reacted at 85° C. for one hour, and then 4,4'-oxydiphthalic anhydride (9.30 g, 0.03 mol) was added along with 5 g of NMP, and the resulting mixture was reacted at 85° C. for one hour. After the completion of the reaction, the reaction mixture was cooled to room temperature, and acetic acid (13.20 g, 0.25 mol) was added along with 25 g of NMP, and the resulting mixture was stirred at room temperature for one hour. After the stirring was finished, the solution was poured into 1.5 L of water to obtain a white precipitate. This precipitate was collected by filtration, washed with water three times, and then dried in a forced-air dryer at 50° C. for three days to obtain a powder of polyamide-polyimide copolymerized resin (A-6). The imidization degree of the resin thus obtained was 80%. The weight average molecular weight was 35,500 and the PDI was 1.9. Based on the values of the feed ratios of the polyamide-derived acid A and the 4,4'-oxydiphthalic anhydride derived from the polyimide-polyimide precursor and the imidization degree, the content of the polyimide structural units based on 100% by mole in total of the structural units of polyamide and polyimide was 55%.

Examples 1 to 10, 12 to 14, Comparative Examples 6 to 8

Varnishes were prepared by using the above-mentioned resins (A-1) to (A-3) as the resin (a), incorporating the components (b), (c), (d), (e) and (f) in the prescribed amounts given in Table 1 for 10 g of the resins (A-1) to (A-3), and adding 20 g of γ-butyrolactone.

Comparative Example 1

A varnish was prepared by using the above-mentioned phenol resin (A-4) instead of the resin component (a), incorporating the components (b), (c) and (d) in the prescribed amounts given in Table 1 for 10 g of the component (A-4), and adding 20 g of γ-butyrolactone.

Example 11

A varnish was prepared by using the above-mentioned resin (A-5) as the resin (a), incorporating the components (b), (c) and (d) in the prescribed amounts given in Table 1 for 10 g of the resin (A-5), adding 2.0 g of a polymerization initiator (C-2) and 2.0 g of a photopolymerizable compound (C-3) instead of the naphthoquinonediazide compound (c), and adding 20 g of γ-butyrolactone.

Example 15

A varnish was prepared by using the above-mentioned resin (A-5) as the resin (a), incorporating the components (b) and (d) in the prescribed amounts given in Table 1 for 10 g of the resin (A-5), and adding 20 g of γ-butyrolactone.

Comparative Example 9

A varnish was prepared by using the above-mentioned resin (A-5) as the resin (a), incorporating the component (b) in the prescribed amounts given in Table 1 for 10 g of the resin (A-5), and adding 20 g of γ-butyrolactone.

The characteristic results of the resin compositions obtained in the Examples and the Comparative Examples are shown in Table 2.

TABLE 1

Addition amount of each component in photosensitive resin composition

| | Resin (a) 10 g | Component (b) | Component (c) | Component (d) | Component (e) | Component (f) |
|---|---|---|---|---|---|---|
| Example 1 | A-1 | (B-1) 0.15 g | (C-1) 2.0 g | (D-1) 3.0 g | — | — |
| Example 2 | A-2 | (B 1) 0.15 g | (C-1) 2.0 g | (D-1) 3.0 g | — | — |
| Example 3 | A-2 | (B-1) 0.15 g | (C-1) 2.0 g | (D-2) 3.0 g | — | — |
| Example 4 | A-2 | (B-1) 0.15 g | (C-1) 2.0 g | (D-3) 3.0 g | — | — |
| Example 5 | A-2 | (B-2) 0.15 g | (C-1) 2.0 g | (D-2) 3.0 g | — | — |
| Example 6 | A-2 | (B-3) 0.15 g | (C-1) 2.0 g | (D-2) 3.0 g | — | — |
| Example 7 | A-3 | (B-2) 0.15 g | (C-1) 2.0 g | (D-2) 3.0 g | — | — |
| Example 8 | A-3 | (B-2) 0.15 g | (C-1) 2.0 g | (D-2) 3.0 g | (E-1) 0.15 g | — |
| Example 9 | A-3 | (B-2) 0.15 g | (C-1) 2.0 g | (D-2) 3.0 g | (E-2) 0.15 g | — |
| Example 10 | A-3 | (B-2) 0.15 g | (C-1) 2.0 g | (D-2) 3.0 g | (E-2) 0.15 g | (F) 1.5 g |
| Example 11 | A-5 | (B-1) 0.15 g | — | (D-1) 3.0 g | — | — |
| Example 12 | A-6 | (B-2) 0.15 g | (C-1) 2.0 g | (D-2) 3.0 g | — | — |
| Example 13 | A-7 | (B-2) 0.15 g | (C-1) 2.0 g | (D-2) 3.0 g | — | — |
| Example 14 | A-8 | (B-2) 0.15 g | (C-1) 2.0 g | (D-2) 3.0 g | — | — |
| Example 15 | A-5 | (B-2) 0.15 g | — | (D-2) 3.0 g | — | — |
| Comparative Example 1 | A-4 | (B-1) 0.15 g | (C-1) 2.0 g | (D-1) 3.0 g | — | — |
| Comparative Example 6 | A-2 | (B-1) 0.15 g | (C-1) 2.0 g | (D-4) 3.0 g | — | — |
| Comparative Example 7 | A-2 | (B-1) 0.15 g | (C-1) 2.0 g | (D-5) 3.0 g | — | — |
| Comparative Example 8 | A-1 | — | (C-1) 2.0 g | (D-2) 3.0 g | | |
| Comparative Example 9 | A-5 | (B-1) 0.15 g | — | — | — | — |

TABLE 2

Result of characteristic evaluation

| | In-plane uniformity | | Resolution | | Extensibility evaluation (extension %, judgment) | | | | Metal adhesion evaluation | | | | Evaluation of copper pattern cross-section after TC |
|---|---|---|---|---|---|---|---|---|---|---|---|---|---|
| | Film thickness | Pattern | μm | Judgment | % | Judgment | After TC % | Judgment after TC | Number of peeling | Judgment | Number of peeling after TC | Judgment after TC | Judgment |
| Example 1 | C | B | 7 | B | 25 | C | 20 | C | 5 | B | 12 | B | C |
| Example 2 | B | B | 5 | B | 50 | B | 30 | B | 0 | A | 5 | B | C |
| Example 3 | B | B | 5 | B | 50 | B | 40 | B | 0 | A | 5 | B | C |
| Example 4 | B | B | 5 | B | 55 | B | 41 | B | 0 | A | 6 | B | C |
| Example 5 | A | B | 3 | A | 55 | B | 50 | A | 0 | A | 7 | B | B |
| Example 6 | B | B | 3 | A | 55 | B | 55 | A | 0 | A | 0 | A | A |

TABLE 2-continued

| | In-plane uniformity | | Resolution | | Extensibility evaluation (extension %, judgment) | | | | Metal adhesion evaluation | | | | Evaluation of copper pattern cross-section after TC |
|---|---|---|---|---|---|---|---|---|---|---|---|---|---|
| | Film thickness | Pattern | μm | Judgment | % | Judgment | After TC % | Judgment after TC | Number of peeling | Judgment | Number of peeling after TC | Judgment after TC | Judgment |
| Example 7 | A | B | 3 | A | 99 | A | 60 | A | 0 | A | 0 | A | A |
| Example 8 | A | B | 3 | A | 100 | A | 63 | A | 0 | A | 0 | A | A |
| Example 9 | A | B | 3 | A | 102 | A | 62 | A | 0 | A | 0 | A | A |
| Example 10 | A | A | 3 | A | 110 | A | 70 | A | 0 | A | 0 | A | A |
| Example 11 | C | C | 20 | D | 50 | B | 50 | A | 10 | B | 10 | B | B |
| Example 12 | A | A | 3 | A | 70 | B | 50 | A | 0 | A | 0 | A | A |
| Example 13 | A | A | 3 | A | 85 | A | 60 | A | 0 | A | 0 | A | A |
| Example 14 | A | A | 3 | A | 58 | A | 50 | A | 0 | A | 7 | B | B |
| Example 15 | B | C | 30 | D | 50 | B | 50 | A | 10 | B | 10 | B | B |
| Comparative Example 1 | C | C | 7 | A | 12 | D | 5 | D | 5 | B | 52 | D | D |
| Comparative Example 6 | D | C | 7 | B | 55 | B | 15 | D | 0 | A | 40 | D | D |
| Comparative Example 7 | C | D | 7 | B | 50 | B | 13 | D | 0 | A | 50 | D | D |
| Comparative Example 8 | C | C | 7 | B | 25 | C | 15 | D | 5 | B | 25 | D | D |
| Comparative Example 9 | D | D | 20 | D | 50 | B | 45 | B | 10 | B | 20 | D | C |

(B-1) to (B-3), (C-1) to (C-3), (D-1) to (D-5), (E-1) to (E-2), and (F) are the compounds represented by the following chemical formulas, respectively.

[Chemical Formula 32]

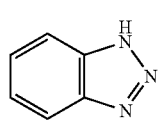

(B-1)

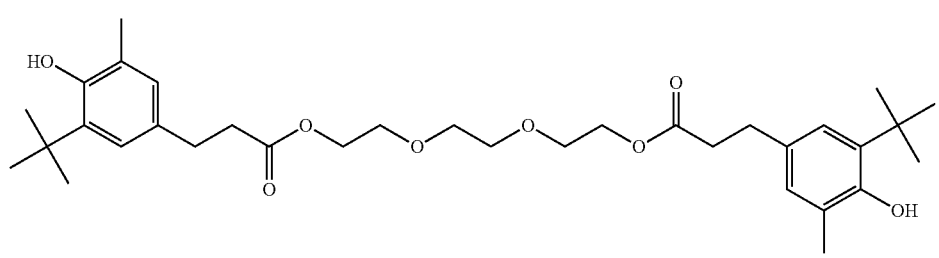

(B-2)

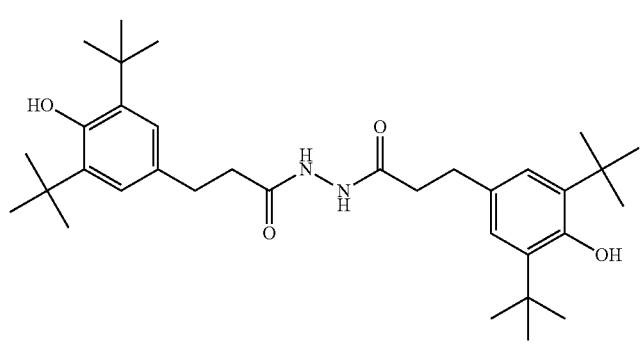

(B-3)

-continued
[Chemical Formula 33]
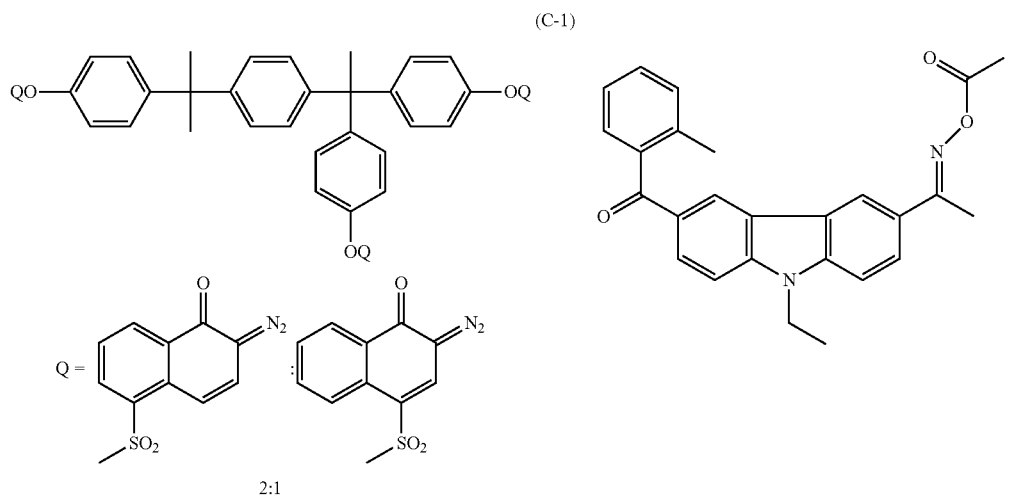
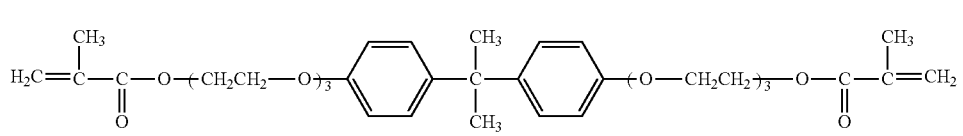
[Chemical Formula 34]
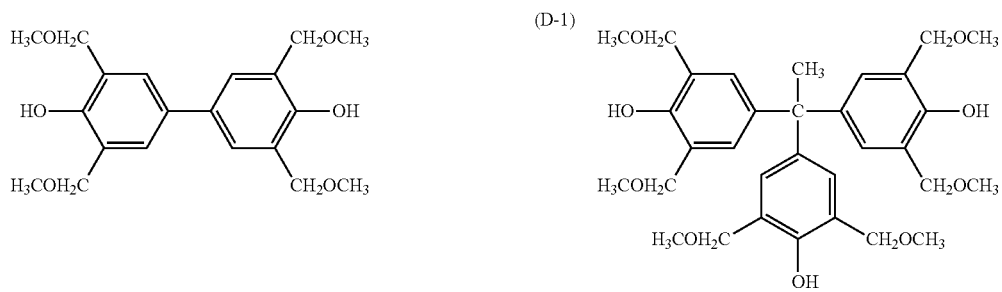
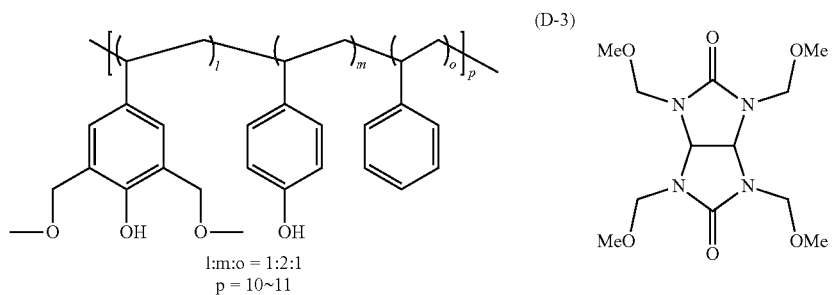

[Chemical Formula 35]

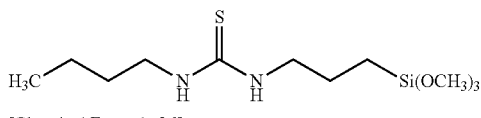 (E-1)

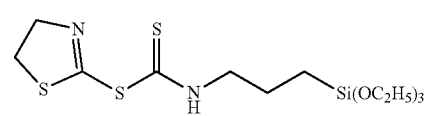 (E-2)

[Chemical Formula 36]

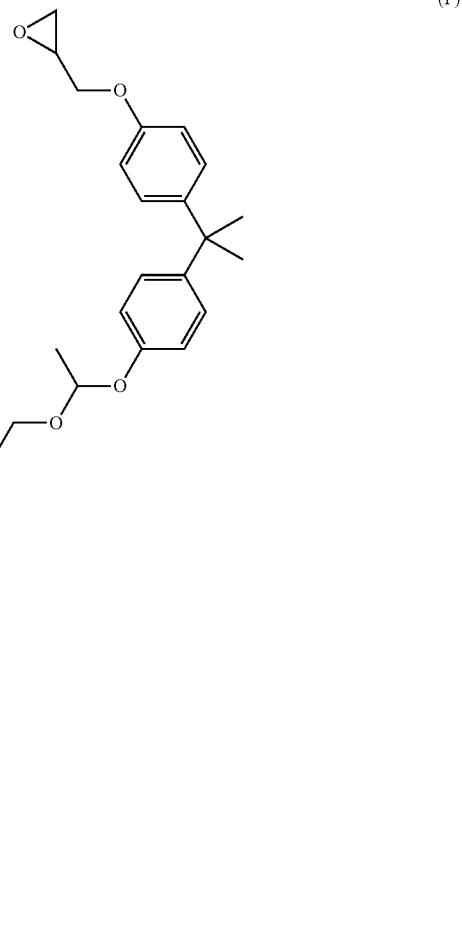 (F)

DESCRIPTION OF REFERENCE SIGNS

1: Silicon wafer
2: Al pad
3: Passivation film
4: Insulating film
5: Metal (Cr, Ti, etc.) film
6: Metal wiring (Al, Cu, etc.)
7: Insulating film
8: Barrier metal
9: Scribe line
10: Solder bump
11: Sealing resin
12: Substrate
13: Insulating film
14: Insulating film
15: Metal (Cr, Ti, etc.) film
16: Metal wiring (Ag, Cu, etc.)
17: Metal wiring (Ag, Cu, etc.)
18: Electrode
19: Sealing resin
20: Support substrate (glass substrate, silicon wafer)
21: Electrode pad (Cu)
22: Insulating film
23: Metal wiring (Cu)
24: Cu post
25: Solder bump
26: Semiconductor chip
27: TFT (thin film transistor)
28: Wiring
29: TFT insulating layer
30: Flattening layer
31: ITO (transparent electrode)
32: Substrate
33: Contact hole
34: Insulating layer

The invention claimed is:

1. A resin composition comprising:
   a resin (a);
   an antioxidizing agent (b); and
   a crosslinking agent (d),
   wherein
   the resin (a) contains one or more resins selected from a polyimide precursor, a polyamide, a polyimide, polybenzoxazole, and copolymers thereof,
   the crosslinking agent (d) is a crosslinking agent having a phenolic hydroxyl group in one molecule thereof and having substituents each with a molecular weight of 40 or more at both ortho positions to the phenolic hydroxyl group, and
   the resin (a) contains at least a copolymer of a polyamide and a polyimide, wherein the copolymer has a content of polyimide structural units in a range of 2 to 50% by mole based on 100% by mole of polyamide structural units and polyimide structural units in total.

2. The resin composition according to claim 1, wherein the resin (a) is an alkali-soluble resin having a phenolic hydroxyl group, and the resin composition further contains a naphthoquinonediazide compound (c).

3. The resin composition according to claim 1, wherein the crosslinking agent (d) is a crosslinking agent having three or more phenolic hydroxyl groups in one molecule.

4. The resin composition according to claim 1, wherein the antioxidizing agent (b) is an antioxidizing agent having a hindered phenol structure.

5. The resin composition according to claim 1, wherein the antioxidizing agent (b) contains a compound represented by formula (1):

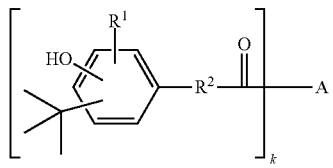

(1)

wherein in formula (I),
R$^1$ represents a hydrogen atom or an alkyl group having 2 or more carbon atoms;
R$^2$ represents an alkylene group having 2 or more carbon atoms;
A represents a monovalent to tetravalent organic group containing at least one of an alkylene group having 2 or more carbon atoms, an O atom, and an N atom; and
k represents an integer of 1 to 4.

6. The resin composition according to claim 1, wherein the resin (a) has a structural unit represented by formula (2):

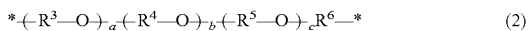

(2)

wherein in formula (2),
R$^3$ to R$^6$ each independently represent an alkylene group having 2 to 10 carbon atoms;
a, b and c each represent an integer within ranges of 1≤a≤20, 0≤b≤20 and 0≤c≤20, and arrangement of repeating units may be either in a block manner or in a random manner; and
* represents a chemical bond.

7. The resin composition according to claim 1, wherein the polyamide of the copolymer has a structural unit derived from a diamine having an aliphatic group, and the polyimide has a content of the structural unit derived from the diamine having an aliphatic group in a range of 5 to 40% by mole based on 100% by mole of structural units derived from diamines in the polyamide.

8. The resin composition according to claim 1, further comprising a compound (e) represented by formula (3), wherein the resin composition has a content of the compound (e) represented by formula (3) in a range of 0.5 to 15 parts by mass based on 100 parts by mass of the resin (a),

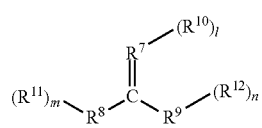

(3)

wherein in formula (3),
R$^7$ to R$^9$ each represent an O atom, an S atom, or an N atom, and at least one of R$^7$ to R$^9$ represents an S atom;
l represents 0 or 1, and m and n represent an integer of 0 to 2; and
R$^{10}$ to R$^{12}$ each independently represent a hydrogen atom or an organic group having 1 to 20 carbon atoms.

9. The resin composition according to claim 1, further comprising a heat-crosslinking agent (1) having a structural unit represented by formula (4) below:

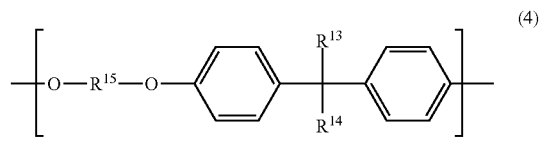

(4)

wherein in formula (4),
R$^{13}$ and R$^{14}$ each independently represent a hydrogen atom or a methyl group; and
R$^{15}$ is a divalent organic group having an alkylene group having 2 or more carbon atoms and may be any of linear, branched, and cyclic.

10. A resin sheet formed from the resin composition according to claim 1.

11. A cured film obtained by curing the resin composition according to claim 1.

12. The cured film according to claim 11, which has an elongation at break of 50% or more.

13. A cured film obtained by curing the resin sheet according to claim 10.

14. A method for producing a relief pattern of a cured film, comprising the steps of:
    applying the resin composition according to claim 2 onto a substrate, followed by drying to form a resin film;
    applying light via a mask;
    eluting or removing an irradiated part with an alkaline solution to perform development; and
    heat treating the resin film after the development.

15. The method for producing a relief pattern of a cured film according to claim 14, wherein the step of applying the resin composition onto a substrate, followed by drying to form a resin film includes a step of applying the resin composition onto the substrate using a slit nozzle.

16. A semiconductor electronic component or semiconductor device, comprising the cured film according to claim 11 disposed as an interlayer insulating film between rewirings of copper metal.

17. The semiconductor electronic component or semiconductor device according to claim 16, wherein the rewirings are composed of oxidized copper metal wirings.

18. The semiconductor electronic component or semiconductor device according to claim 16, wherein the rewirings are copper metal wirings, and a line width of the copper metal wirings and an interval between adjacent wirings are 5 μm or less.

19. The semiconductor electronic component or semiconductor device according to claim 16, wherein the rewirings are copper metal wirings, and a semiconductor chip and each of the copper metal wirings are further connected via a bump.

20. The semiconductor electronic component or semiconductor device according to claim 16, wherein a line width of metal wirings and an interval between adjacent wirings decrease as a rewiring layer recited in claim 16 approaches the semiconductor chip.

21. The semiconductor electronic component or semiconductor device according to claim 16, wherein the interlayer insulating film recited in claim 16 becomes thin in thickness as the interlayer insulating film approaches the semiconductor chip.

22. A semiconductor electronic component or semiconductor device, comprising the cured film according to claim 11 disposed as an interlayer insulating film between rewirings on a sealing resin substrate on which a silicon chip is disposed.

23. An organic EL display device comprising the cured film according claim 11.

24. A method for producing a semiconductor electronic component or semiconductor device, comprising the steps of:
   disposing the cured film according to claim 11 as an interlayer insulating film between rewirings on a support substrate on which a temporary sticking material is disposed;
   disposing a silicon chip and a sealing resin on the support substrate; and
   then peeling off the rewirings from the support substrate on which the temporary sticking material is disposed.

* * * * *